United States Patent
Tseng et al.

(10) Patent No.: US 9,583,436 B2
(45) Date of Patent: Feb. 28, 2017

(54) PACKAGE APPARATUS AND MANUFACTURING METHOD THEREOF

(71) Applicant: PHOENIX PIONEER TECHNOLOGY CO., LTD., Hsinchu County (TW)

(72) Inventors: Chao-Tsung Tseng, Hsinchu County (TW); Shih-Ping Hsu, Hsinchu County (TW); Chin-Ming Liu, Hsinchu County (TW); Che-Wei Hsu, Hsinchu County (TW)

(73) Assignee: PHOENIX PIONEER TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 14/725,447

(22) Filed: May 29, 2015

(65) Prior Publication Data
US 2016/0190059 A1 Jun. 30, 2016

(30) Foreign Application Priority Data
Dec. 30, 2014 (TW) .............................. 103146322 A

(51) Int. Cl.
*H01L 21/768* (2006.01)
*H01L 21/02* (2006.01)
(Continued)

(52) U.S. Cl.
CPC ........ *H01L 23/528* (2013.01); *H01L 21/6835* (2013.01); *H01L 21/7685* (2013.01); *H01L 21/76877* (2013.01); *H01L 23/3107* (2013.01); *H01L 23/481* (2013.01); *H01L 23/4828* (2013.01); *H01L 23/5226* (2013.01); *H01L 21/568* (2013.01); *H01L 2221/68345* (2013.01); *H01L 2221/68381* (2013.01); *H01L 2224/18* (2013.01); *H01L 2924/0002* (2013.01)

(58) Field of Classification Search
CPC ..................................................... H01L 23/428
USPC ......................................................... 257/774
See application file for complete search history.

(56) References Cited

U.S. PATENT DOCUMENTS 6,313,528 B1 * 11/2001 Solberg ............... H01L 25/0657
257/668
6,784,765 B2 * 8/2004 Yamada .............. H01L 23/5385
257/700

(Continued)

*Primary Examiner* — Long K Tran
*Assistant Examiner* — Thai T Vuong
(74) *Attorney, Agent, or Firm* — WPAT, PC; Justin King

(57) ABSTRACT

A package apparatus comprises a first conductive wiring layer, a first conductive pillar layer, a first conductive glue layer, an internal component, a second conductive pillar layer, a first molding compound layer and a second conductive wiring layer. The first conductive pillar layer is disposed on the first conductive wiring layer. The first conductive glue layer is disposed on the first conductive wiring layer. The internal component has a first electrode layer and a second electrode layer, wherein the first electrode layer is disposed and electrical connected to the first conductive glue layer. The second conductive pillar layer is disposed on the second electrode layer. Wherein the first conductive wiring layer, the first conductive pillar layer, the first conductive glue layer, the internal component and the second conductive pillar layer are disposed inside the first molding compound layer.

9 Claims, 29 Drawing Sheets

(51) Int. Cl.
*H01L 21/3205* (2006.01)
*H01L 21/336* (2006.01)
*H01L 23/528* (2006.01)
*H01L 23/482* (2006.01)
*H01L 23/522* (2006.01)
*H01L 23/31* (2006.01)
*H01L 23/48* (2006.01)
*H01L 21/683* (2006.01)
*H01L 21/56* (2006.01)

(56) References Cited

U.S. PATENT DOCUMENTS

| | | | |
|---|---|---|---|
| 7,198,996 B2* | 4/2007 | Nakatani | H01L 21/4857 257/E21.205 |
| 8,072,059 B2* | 12/2011 | Shim | H01L 25/0655 257/698 |
| 8,236,617 B2* | 8/2012 | Pagaila | H01L 21/561 257/660 |
| 8,343,808 B2* | 1/2013 | Lin | H01L 21/56 257/E21.505 |
| 2001/0028114 A1* | 10/2001 | Hosomi | G11C 8/12 257/778 |
| 2004/0145044 A1* | 7/2004 | Sugaya | H01L 23/5389 257/698 |
| 2004/0203193 A1* | 10/2004 | Ooi | H01L 21/4857 438/118 |
| 2006/0091514 A1* | 5/2006 | Yang | H01L 21/561 257/678 |
| 2007/0045815 A1* | 3/2007 | Urashima | H05K 1/0231 257/698 |
| 2008/0111233 A1* | 5/2008 | Pendse | H01L 23/3121 257/712 |
| 2011/0037154 A1* | 2/2011 | Shim | H01L 21/561 257/676 |

* cited by examiner

PACKAGE APPARATUS AND MANUFACTURING METHOD THEREOF

FIELD OF THE INVENTION

The present invention relates to a package apparatus and manufacturing method thereof, and more particularly, to a semiconductor package apparatus and method for manufacturing the same.

BACKGROUND OF THE INVENTION

With the design trend in electronic devices is toward lighter, smaller, thinner but more functional devices with performance requirements continuing to increase, device manufacturers increasingly need specialty integrated circuit (IC) solutions for allowing billions of miniature electronic components to be densely packed in a small area. Thus, device manufacturers come up with innovative packaging techniques for embedding electronic components in a substrate while allowing shorter traces between the electronic components and the substrate. In addition, the layout area is increased by the use of built-up technique as the technology advances for achieving lighter, smaller, thinner and more functional high-performance devices.

Generally, most high-end chips are packaged by flip chip (FC) process, especially by a chip scale package (CSP) process, as those high-end chips are primarily being applied in smart phones, tablet computers, network communication devices, and notebook computers, whichever is generally operating under high-frequency and high-speed condition and required to be packed in a thin, small and light-weighted semiconductor package. As for the carrier for packaging, the popular design nowadays includes: small pitches between lines, high density, thin-type design, low manufacture cost, and high electrical characteristic.

Please refer to FIG. 1, which shows a conventional fiberglass substrate packaging structure. In FIG. 1, the fiberglass substrate packaging structure 10A has a fiberglass substrate 100A, which is formed with a groove 110A and a plurality of via holes 120A by a laser via method. In addition, the groove 110A can be used for receiving and holding an electronic component 130A, while a portion of the plural via holes 120A can be provided for receiving a conductive metal pillar 140A. As shown in FIG. 1, the two first conductive metal layers 142A, 144A are respectively disposed on the fiberglass substrate 100A while allowing the two to connected electrically to the conductive metal pillar 140A; the groove 110A and the electronic component 130A are covered and sealed by an insulation layer 150A, whereas the electronic component 130A, the plural via holes 120A, two second conductive metal layers 146A, 148A to be disposed on the insulation layer 150A while being connected electrically to the electronic component 130A and the two first conductive metal layers 142A, 144A.

However, the aforesaid conventional fiberglass substrate packaging structure is disadvantageous in that: it can be very costly for using a fiberglass substrate as its substrate in addition to that the thin-type fiberglass substrate can be easily deformed and wrapped, and the conventional substrate including fiberglass will increase the difficulty of processing for laser via so that it cannot fit the need of fine pitch therefore make the wiring more troublesome; and as the blind/buried vias in the aforesaid four-layered metal laminated structure are formed by the repetition of a laser via method, such repetition can be a complex and time consuming process and also the cost for fabricating the four-layered metal laminated structure can be costly. Therefore, the aforesaid conventional fiberglass substrate packaging structure does not have industrial advantages.

SUMMARY OF THE INVENTION

The present invention provides a package apparatus and manufacturing method thereof, by which a dielectric material layer or a molding compound layer can be used as the major material in the manufacturing of a coreless substrate, whereas a plating conductive pillar layer is provided in the coreless substrate so as to be used for achieving electrical connection, and moreover, during the manufacturing of the coreless substrate, a conductive adhesive layer is formed by the use of a dispense process or a print process so as to be used for fixing and embedding a plurality of internal components inside the coreless substrate. Thereby, a coreless substrate structure with embedded internal components can be achieved that is thin-type structure with good rigidity.

Moreover, in the present invention, an additive layout process is used for formed a dielectric material layer that can be used for replacing a first molding compound layer in a conventional molding compound substrate structure, and thereby the production complexity is decreased as the conventional problem of insufficient binding force between the first molding compound layer and the other conductive layers that is generally seen in the fabrication of fine-line products and required to be solved by an additional dielectric material layer is eliminated.

In addition, the present invention also provides a package apparatus and manufacturing method thereof, in which a solder resist layer that is generally seen in those conventional molding compound substrate structures or embedded pattern plating (EPP) substrate structures is replaced by a first molding compound layer and thus the process used for forming the solder resist layer can be avoided, so that the conventional problems resulting from the poor resolution of solder mask opens in the BGA and the poor film thickness uniformity of the solder resist layer are avoided and thus the reliability of any posterior process is improved.

In an embodiment, the present invention provides a package apparatus, which comprises: a first conductive wiring layer; a first conductive pillar layer, disposed on the first conductive wiring layer; a first conductive glue layer, disposed on the first conductive wiring layer; an internal component, formed with a first electrode layer and a second electrode layer in a manner that the first electrode layer is disposed and electrically connected to the first conductive glue layer; a second conductive pillar layer, disposed on the second electrode layer of the internal component; a first molding compound layer; and a second conductive wiring layer, disposed on the first conductive pillar layer, the second conductive pillar layer and the first molding compound layer; wherein, the first conductive wiring layer, the first conductive pillar layer, the first conductive glue layer, the internal component and the second conductive pillar layer are disposed inside the first molding compound layer.

Preferably, in the aforesaid package apparatus, the first conductive pillar layer is composed of at least two layers of conductive pillar with equal or unequal line widths.

Preferably, in the aforesaid package apparatus, the first conductive glue layer is composed of at least two layers of conductive glue with equal or unequal line widths.

Preferably, the first molding compound layer in the aforesaid package apparatus is substantially a dielectric material layer.

Preferably, in the aforesaid package apparatus, the first molding compound layer is composed of at least two layers of dielectric material, and thereby, the first conductive wiring layer is disposed inside a first dielectric material layer, and the first conductive glue layer, the internal component, the first conductive pillar layer and the second conductive pillar layer are disposed inside a second dielectric material layer.

In an embodiment, the present invention provides a method for manufacturing a package apparatus, which comprises the steps of: providing a carrier; forming a first conductive wiring layer on the carrier; forming a first conductive glue layer on the first conductive wiring layer; providing an internal component that is formed with a first electrode layer and a second electrode layer and thus is electrically connected to the first conductive glue layer by the first electrode layer; forming a second conductive pillar layer on the second electrode layer of the internal component; forming a first molding compound layer on the carrier while allowing the first molding compound layer to cover the first conductive wiring layer, the first conductive pillar layer, the first conductive glue layer, the internal component and the second conductive pillar layer; exposing the first conductive pillar layer and the second conductive pillar layer; forming a second conductive wiring layer on the first conductive pillar layer, the second conductive pillar layer and the first molding compound layer; and removing the carrier.

Moreover, the aforesaid method for manufacturing a package apparatus further comprises the steps of: forming a third conductive pillar layer on the first conductive pillar layer while allowing the third conductive pillar layer to be covered inside the first molding compound layer, and enabling the third conductive pillar layer to be formed with a line width that is larger than, smaller than or equal to the line width of the first conductive pillar layer; and exposing an end surface of the third conductive pillar layer for connecting to the second conductive wiring layer. Preferably, the first conductive glue layer being formed in the aforesaid method for manufacturing a package apparatus is composed of at least two layers of conductive glue with equal or unequal line widths.

In another embodiment, the present invention provides a method for manufacturing a package apparatus, which comprises the steps of: providing a carrier; forming a first conductive wiring layer on the carrier; forming a first molding compound layer on the carrier while allowing the first conductive wiring layer to be covered by the first molding compound layer; exposing the first conductive wiring layer; forming a first conductive glue layer on the first conductive wiring layer while allowing the first conductive glue to be disposed inside the first molding compound layer; forming a second conductive glue layer on the first conductive glue layer; forming a first conductive pillar layer on the first conductive wiring layer while allowing the first conductive pillar layer to be disposed inside the first molding compound layer; forming a second conductive pillar layer on the first conductive pillar layer; forming a third conductive pillar layer on the second conductive pillar layer; providing an internal component that is formed with a first electrode layer and a second electrode layer and thus is electrically connected to the second conductive glue layer by the first electrode layer; forming a forth conductive pillar layer on the second electrode layer of the internal component; forming a second molding compound layer on the first molding compound layer while allowing the second molding compound layer to cover the second conductive glue layer, the second conductive pillar layer, the third conductive pillar layer, the internal component and the forth conductive pillar layer; exposing the third conductive pillar layer and the fourth conductive pillar layer; forming a second conductive wiring layer on the third conductive pillar layer, the fourth conductive pillar layer and the second molding compound layer; and removing the carrier. It is noted that the first conductive pillar layer is formed with a line width that is larger than, smaller than or equal to the line width of the second conductive pillar layer.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 2:
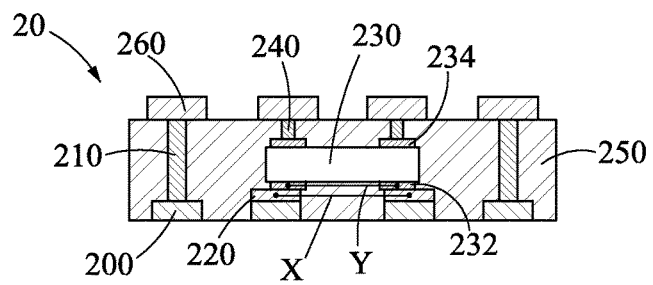
FIG. 2 is schematic diagram showing a package apparatus according to a first embodiment of the present invention.

Please refer to FIG. 2, which is schematic diagram showing a package apparatus according to a first embodiment of the present invention. As shown in FIG. 2, the package apparatus 20 comprises: a first conductive wiring layer 200, a first conductive pillar layer 210, a first conductive glue layer 220, an internal component 230, a second conductive pillar layer 240, a first molding compound layer 250 and a second conductive wiring layer.

In this embodiment, the first conductive pillar layer 210 is disposed on the first conductive wiring layer 200, and the first conductive glue layer 220 is also disposed on the first conductive wiring layer 200, whereas the first conductive glue layer 220 can be formed by a process selected from the group consisting of: a dispense process and a print process, but is not limited thereby. Moreover, the internal component 230 is formed with a first electrode layer 232 and a second electrode layer 234 in a manner that the first electrode layer 232 is disposed and electrically connected to the first conductive glue layer 220. It is noted that the internal component 230 can be a component selected from the group consisting of: an active component, a passive component, and a semiconductor chip, but is not limited thereby. The second conductive pillar layer 240 is disposed on the second electrode layer 234 of the internal component 230.

In addition, the first conductive wiring layer 200, the first conductive pillar layer 210, the first conductive glue layer 220, the internal component 230 and the second conductive pillar layer 240 are all disposed inside the first molding compound layer 250, whereas the first molding compound layer 250 can be made of a molding compound material for chip packaging selected from the group consisting of: a novolac-based resin, an epoxy-based resin, a silicon-based resin and other molding compounds, but is not limited thereby. In this embodiment, the second conductive wiring layer 260 is disposed on the first conductive pillar layer 210, the second conductive pillar layer 240 and the first molding compound layer 250, while each of the first conductive wiring layer 200 and the second conductive wiring layer 260 can be a wiring layer with patterns which includes at least one wire or at least one chip seat, but is not limited thereby.

In the embodiment shown in FIG. 2, the first conductive glue layer 220 is composed of two conductive glues, and the first electrode layer 232 is composed of two electrodes, while the distance X between the centers of the two conductive glues is larger than, smaller than or equal to the distance Y between the centers of the electrodes, which can be determined according to actual requirement. That is, in a condition when X is designed to be larger than Y, there can be more wires to be accommodated in a space under the internal component 230, but in a condition when X is designed to be smaller than Y, there can be more wires to be arranged surrounding the periphery of the conductive glues.

Figure 3:
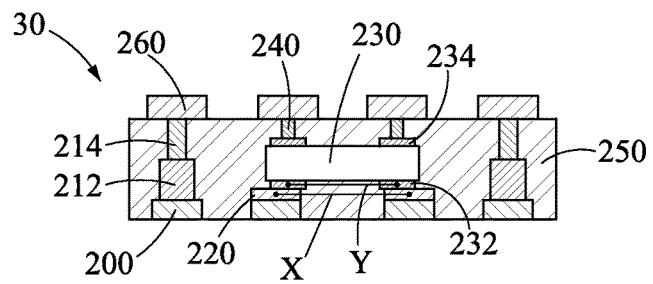
FIG. 3 is schematic diagram showing a package apparatus according to a second embodiment of the present invention.

Please refer to FIG. 3, which is schematic diagram showing a package apparatus according to a second embodiment of the present invention. The package apparatus 30 is formed similar to the package apparatus 20 of the first embodiment, but is different in that: in the package apparatus 30 of FIG. 3, the first conductive pillar layer 210 in the package apparatus 20 of FIG. 2 is replaced by a third conductive pillar layer 212 and a fourth conductive pillar layer 214, while enabling the third conductive pillar layer 212 to be disposed on the first conductive wiring layer 200 and the two ends of the fourth conductive pillar layer 214 to be connected respectively to the third conductive pillar layer 212 and the second conductive wiring layer 260, whereas each of the third conductive pillar layer 212 and the fourth conductive pillar layer 214 can be formed as a layer selected from the group consisting of: a layer of cuboid-shaped conductive pillars, a layer of cylinder-shaped pillars, and a layer of polyhedron-shaped pillars, but is not limited thereby. Moreover, the third conductive pillar layer 212 can be formed with a line width that is larger than, smaller than ore equal to the line width of the fourth conductive pillar layer 214 according to actual requirements of different embodiments. In the embodiment shown in FIG. 3, the third conductive pillar layer 212 is formed with a line width that is larger than the line width of the fourth conductive pillar layer 214.

Figure 4:
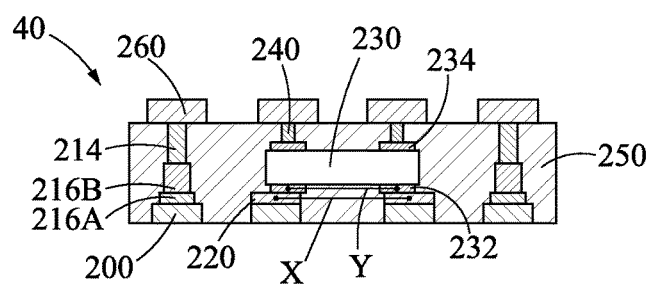
FIG. 4 is schematic diagram showing a package apparatus according to a third embodiment of the present invention.

Please refer to FIG. 4, which is schematic diagram showing a package apparatus according to a third embodiment of the present invention. The package apparatus 40 is formed similar to the package apparatus 30 of the second embodiment, but is different in that: in the package apparatus 40 of FIG. 4, the third conductive pillar layer 212 in the package apparatus 30 of FIG. 3 is replaced by a fifth conductive pillar layer 216A and a sixth conductive pillar layer 216B, while enabling the fifth conductive pillar layer 216A to be disposed on the first conductive wiring layer 200 and the two ends of the sixth conductive pillar layer 216B to be connected respectively to the fifth conductive pillar layer 216A and the fourth conductive wiring layer 214, whereas each of the fifth conductive pillar layer 216A and the sixth conductive pillar layer 216B can be formed as a layer selected from the group consisting of: a layer of cuboid-shaped conductive pillars, a layer of cylinder-shaped pillars, and a layer of polyhedron-shaped pillars, but is not limited thereby. Moreover, the fifth conductive pillar layer 216A can be formed with a line width that is larger than, smaller than ore equal to the line width of the sixth conductive pillar layer 216B according to actual requirements of different embodiments.

Figure 5:
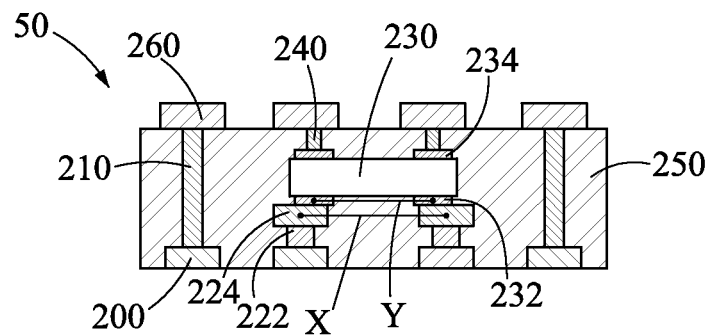
FIG. 5 is schematic diagram showing a package apparatus according to a fourth embodiment of the present invention.

Please refer to FIG. 5, which is schematic diagram showing a package apparatus according to a fourth embodiment of the present invention. The package apparatus 50 is formed similar to the package apparatus 20 of the first embodiment, but is different in that: in the package apparatus 50 of FIG. 5, the first conductive glue layer 220 in the package apparatus 20 of FIG. 2 is replaced by a second conductive glue layer 222 and a third conductive glue layer 224, while enabling the second conductive glue layer 222 to be disposed on the first conductive wiring layer 200 and the two ends of the third conductive glue layer 224 to be connected respectively to the second conductive glue layer 222 and the first electrode layer 232, whereas each of the second conductive glue layer 222 and the third conductive glue layer 224 can be formed as a layer selected from the group consisting of: a layer of cuboid-shaped conductive pillars, a layer of cylinder-shaped pillars, and a layer of polyhedron-shaped pillars, but is not limited thereby. Moreover, the second conductive glue layer 222 can be formed with a line width that is larger than, smaller than ore equal to the line width of the third conductive glue layer 224 according to actual requirements of different embodiments. In another embodiment, the second conductive glue layer 222 is composed of two conductive glues, and the first electrode layer 232 is composed of two electrodes, while the distance X between the centers of the two conductive glues is larger than, smaller than or equal to the distance Y between the centers of the electrodes, which can be determined according to actual requirement.

Figure 6:
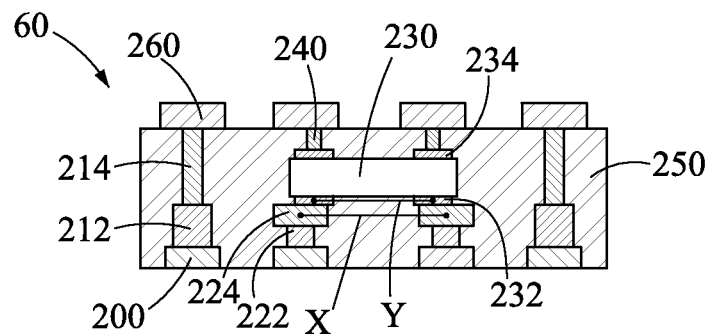
FIG. 6 is schematic diagram showing a package apparatus according to a fifth embodiment of the present invention.

Please refer to FIG. 6, which is schematic diagram showing a package apparatus according to a fifth embodiment of the present invention. The package apparatus 60 is formed similar to the package apparatus 50 of the fourth embodiment, but is different in that: in the package apparatus 60 of FIG. 6, the first conductive pillar layer 210 in the package apparatus 50 of FIG. 5 is replaced by a third conductive pillar layer 212 and a fourth conductive pillar layer 214, whereas each of the third conductive pillar layer 212 and the fourth conductive pillar layer 214 can be formed as a layer selected from the group consisting of: a layer of cuboid-shaped conductive pillars, a layer of cylinder-shaped pillars, and a layer of polyhedron-shaped pillars, but is not limited thereby. Moreover, the third conductive pillar layer 212 can be formed with a line width that is larger than, smaller than ore equal to the line width of the fourth conductive pillar layer 214 according to actual requirements of different embodiments.

Figure 7:
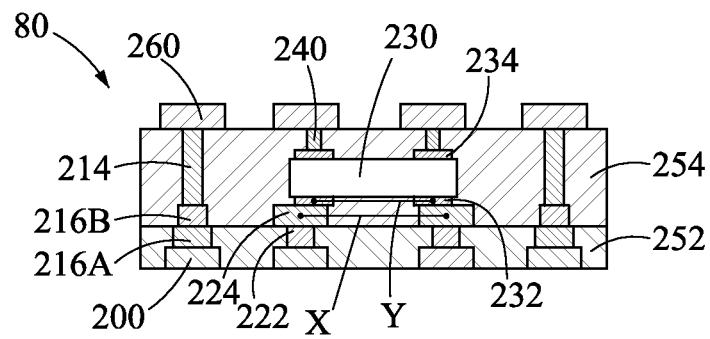
FIG. 7 is schematic diagram showing a package apparatus according to a sixth embodiment of the present invention.

Please refer to FIG. 7, which is schematic diagram showing a package apparatus according to a sixth embodiment of the present invention. The package apparatus 80 is formed similar to the package apparatus 60 of the fifth embodiment, but is different in that: in the package apparatus 80 of FIG. 7, the third conductive pillar layer 212 in the package apparatus 60 of FIG. 6 is replaced by a fifth conductive pillar layer 216A and a sixth conductive pillar layer 216B, whereas each of the fifth conductive pillar layer 216A and the sixth conductive pillar layer 216B can be formed as a layer selected from the group consisting of: a layer of cuboid-shaped conductive pillars, a layer of cylinder-shaped pillars, and a layer of polyhedron-shaped pillars, but is not limited thereby. Moreover, the fifth conductive pillar layer 216A can be formed with a line width that is larger than, smaller than ore equal to the line width of the sixth conductive pillar layer 216B according to actual requirements of different embodiments. In addition, in the package apparatus 80,m the first molding compound layer 250 in the package apparatus 60 of FIG. 6 can also be replaced by a second molding compound layer 252 and a third molding compound layer 254, in which the third molding compound layer 254 is disposed on the second molding compound layer 252 while enabling the first conductive wiring layer 200, the fifth conductive pillar layer 216A and the second conductive glue layer 222 to be disposed inside the second molding compound layer 252, and simultaneously enabling the sixth conductive pillar layer 216B, the fourth conductive pillar 214, the third conductive glue layer 224, the internal component 230 and the second conductive pillar layer 240 to be disposed inside the third molding compound layer 254.

Figure 8:
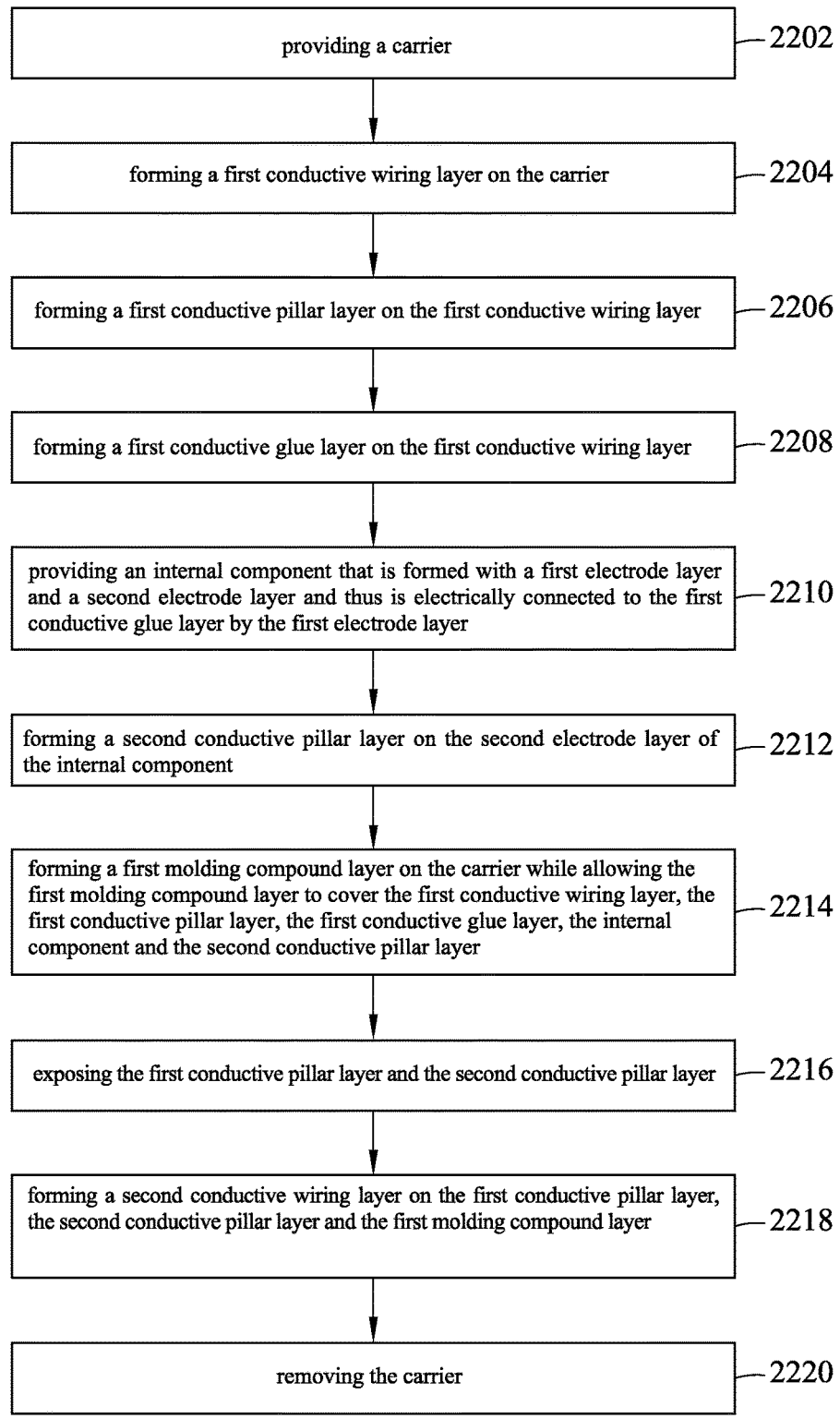
FIG. 8 is a flow chart depicting steps performing in a method for manufacturing a package apparatus of the first embodiment of the present invention.
Figure 9A:
FIG. 9A to FIG. 9I are schematic diagrams illustrating the manufacturing of the package apparatus of the first embodiment.
Figure 9B:
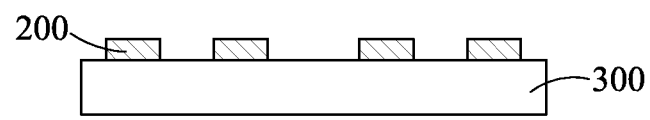
Figure 9C:
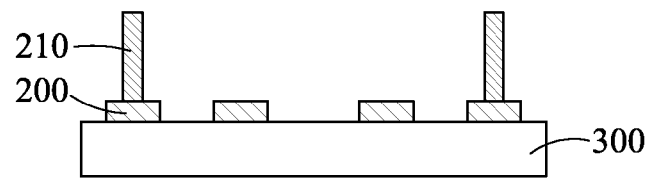
Figure 9D:
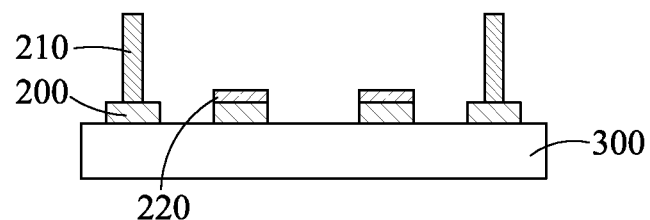
Figure 9E:
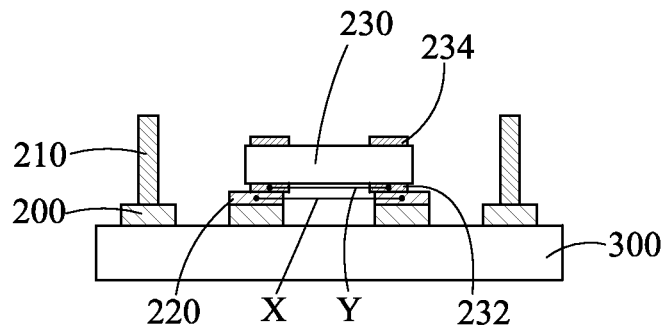
Figure 9F:
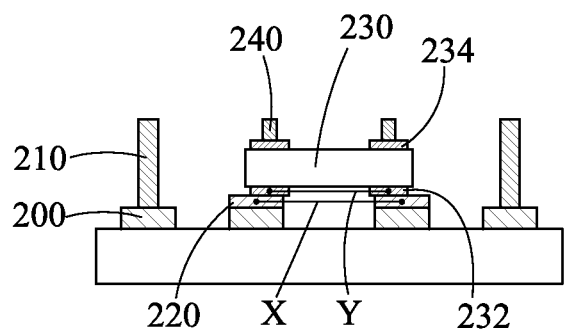
Figure 9G:
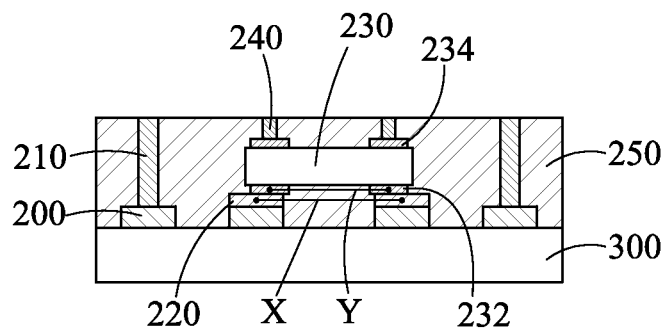
Figure 9H:
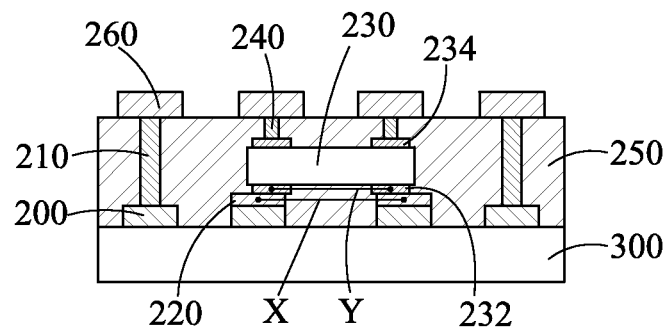
Figure 9I:
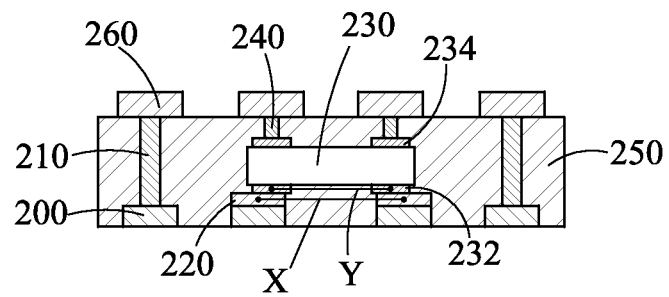
Figure 10:
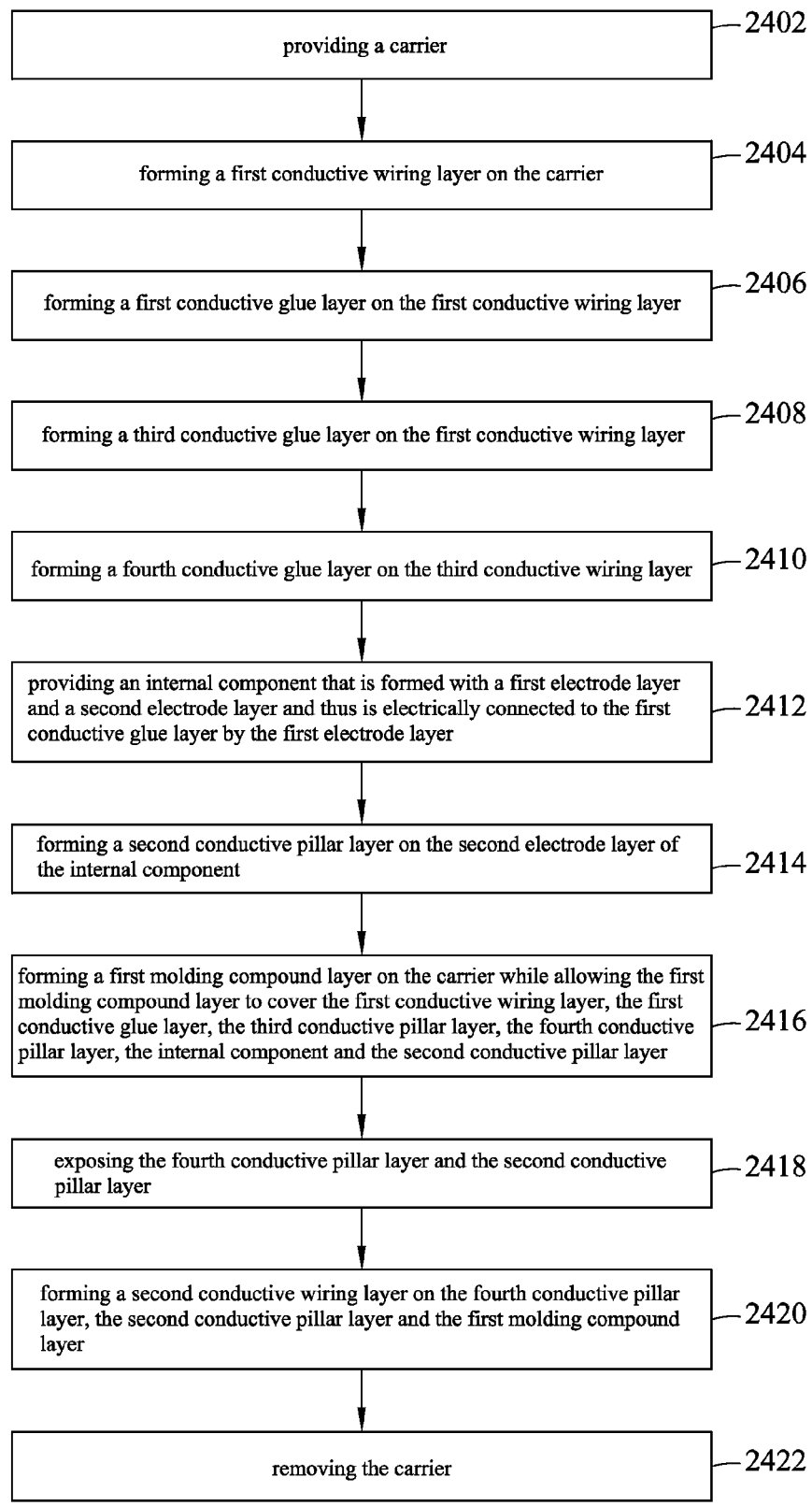
FIG. 10 is a flow chart depicting steps performing in a method for manufacturing a package apparatus of the second embodiment of the present invention.
Figure 11A:
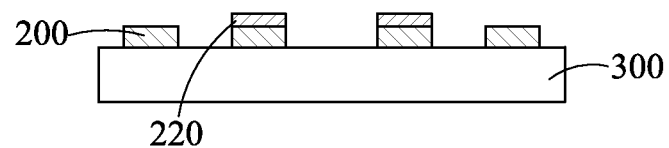
FIG. 11A to FIG. 11H are schematic diagrams illustrating the manufacturing of the package apparatus of the second embodiment.
Figure 11B:
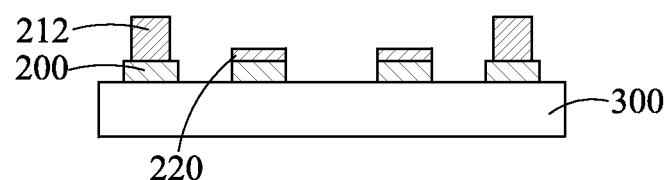
Figure 11C:
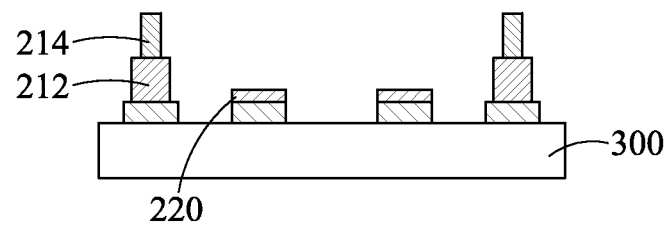
Figure 11D:
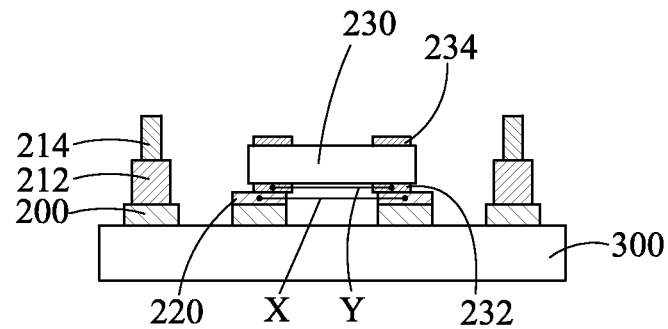
Figure 11E:
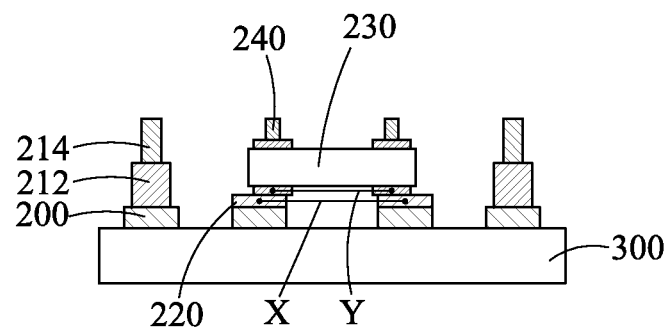
Figure 11F:
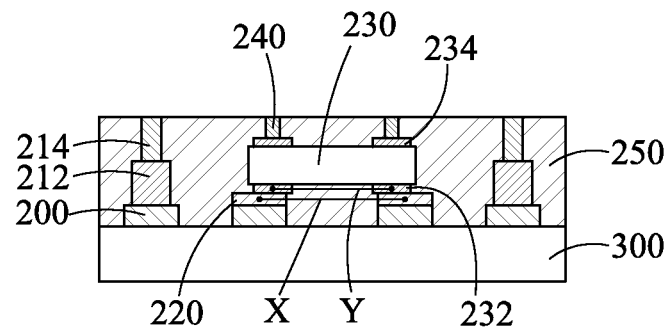
Figure 11G:
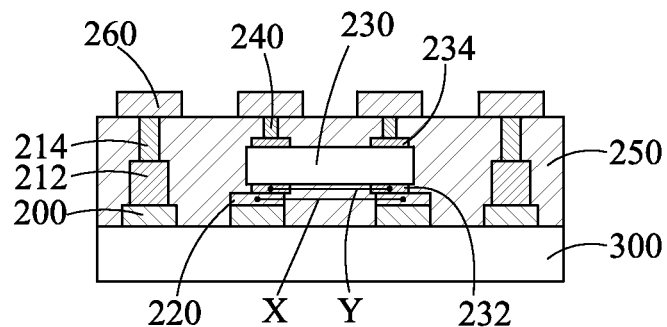
Figure 11H:
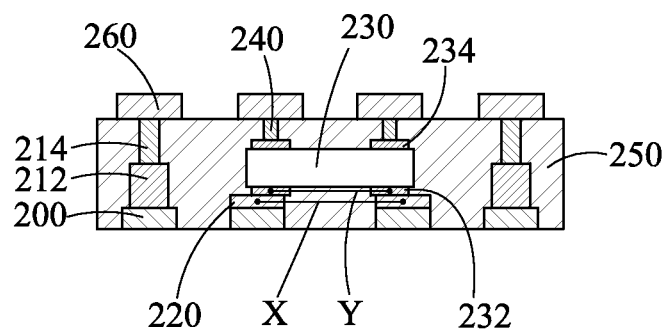

Please refer to FIG. 8, which is a flow chart depicting steps performing in a method for manufacturing a package apparatus of the first embodiment of the present invention, and also please refer to FIG. 9A to FIG. 9I, which are schematic diagrams illustrating the manufacturing of the package apparatus of the first embodiment. As shown in FIG. 8, a method 80 for manufacturing the package apparatus 20 comprises the following steps:

step 2202: providing a carrier 300, whereas the carrier can be made of a metal, glass or other materials and in this embodiment, the carrier 300 is a metal carrier, such as copper, as shown in FIG. 9A;

step 2204: forming a first conductive wiring layer 200 on the metal carrier 300, as shown in FIG. 9B, whereas the first conductive wiring layer 200 is formed using an electrolytic plating process in this embodiment, but is not limited thereby, and moreover, the first conductive wiring layer 200 can be a wiring layer with patterns which includes at least one wire or at least one chip seat, and the first conductive wiring layer 200 can be made of a metal, such as copper;

step 2206: forming a first conductive pillar layer 210 on the first conductive wiring layer 200, as shown in FIG. 9C, whereas the first conductive pillar layer 210 is formed using an electrolytic plating process in this embodiment, but is not limited thereby, and moreover, the first conductive pillar layer 220 can be made of a metal, such as copper and is formed at a position corresponding to the wires or the chip seat of the first conductive wiring layer 200;

step 2208: forming a first conductive glue layer 220 on the first conductive wiring layer 200, as shown in FIG. 9D, whereas the first conductive glue layer 220 is formed using a dispense process or a print process, and can be made of a metal, such as silver, or tin, but is not limited thereby;

step 2210: providing an internal component 230 that is formed with a first electrode layer 232 and a second electrode layer 234 and thus is electrically connected to the first conductive glue layer 220 by the first electrode layer 232, as shown in FIG. 9E, whereas, in this embodiment, the internal component 232 is a component selected from the group consisting of: an active component, a passive component, and a semiconductor chip, while the first conductive glue layer 220 is composed of two conductive glues, and the first electrode layer 232 is composed of two electrodes, while the distance X between the centers of the two conductive glues is larger than, smaller than or equal to the distance Y between the centers of the electrodes, and in this embodiment, the distance X between the centers of the two conductive glues is larger than the distance Y between the centers of the electrodes, but is not limited thereby;

step 2212: forming a second conductive pillar layer 240 on the second electrode layer 234 of the internal component 230, as shown in FIG. 9F, whereas the second electrode layer 234 can be made of a metal, but is not limited thereby;

step 2214: forming a first molding compound layer 250 on the carrier 300 for allowing the same to cover the first conductive wiring layer 200, the first conductive pillar layer 210, the first conductive glue layer 220, the internal component 230 and the second conductive pillar layer 240, as shown in FIG. 9G, whereas, in this embodiment, the first molding compound layer 250 is formed by a transfer molding process, a top molding process, a compression molding process, an injection molding process, or a vacuum-press casting process, and can be made from a material selected from the group consisting of novolac-based resin, epoxy-based resin, silicon-based resign and other molding compounds, and moreover the first molding compound layer 250 can be composed of a kind of filler, such as a powder silicon dioxide; and in another embodiment, the formation of the first molding compound layer 250 can include the steps of: providing a molding compound to be heated to a liquid state, whereas the molding compound is composed of a resin and powder silicon dioxide; pouring the liquefied molding compound on the carrier 300 while allowing the molding compound to cover the first conductive wiring layer 200 and the first conductive pillar layer 210, the first conductive glue layer 220, the internal component 230 and the second conductive pillar layer 240 under a high-temperature and high-pressure condition; and curing the molding compound for forming the first molding compound layer 250, but is not limited thereby;

step 2216: enabling one end of each of the first conductive pillar layer 210 and the second conductive pillar layer 240 to be exposed, also as shown in FIG. 9G, whereas in this embodiment, the exposing of the first conductive pillar layer 210 and the second conductive pillar layer 240 is enabled by grinding and removing a portion of the first molding compound layer 250, however, under ideal condition, the exposed ends of the first conductive pillar layer 210 and the second conductive pillar layer 240 are positioned coplanar with the first molding compound layer 250, by that the exposing of the first conductive pillar layer 210 and the second conductive pillar layer 240 can be achieved simultaneously with the formation of the first molding compound layer 250, and thus the process for grinding and removing of the first molding compound layer 250 can be avoided;

step 2218: forming a second conductive wiring layer 260 on the first conductive pillar layer 210, the second conductive pillar layer 240 and the first molding compound layer 250, as shown in FIG. 9H, whereas the second conductive wiring layer 260 can be formed by the use of an electrolytic plating process, an electroless plating process, a sputtering coating process, or a thermal coating process, but is not limited thereby, and moreover, the second conductive wiring layer 260 can be a wiring layer with patterns which includes at least one wire or at least one chip seat and is a layer formed at a position corresponding to the exposed end of the first conductive pillar layer 210 or the exposed end of the second conductive pillar layer 240, moreover, the second conductive wiring layer 260 can be made of a metal, such as copper;

step 2220: removing the metal carrier 300 for exposing the wires and the chip seat of the first conductive wiring layer 200, as shown in FIG. 9I, whereas the removal of the metal carrier 300 can be performed using an etching process, or a debonding process, or even a physical process of grinding, but is not limited thereby;

Please refer to FIG. 10, which is a flow chart depicting steps performing in a method for manufacturing a package apparatus of the second embodiment of the present invention, and also please refer to FIG. 11A to FIG. 11H, which are schematic diagrams illustrating the manufacturing of the package apparatus of the second embodiment. As shown in FIG. 10, the step 2402 for providing a carrier 300, and the step 2404 for forming a first conductive wiring layer are performed exactly the same as the step 2202 and the step 2204 that are shown in FIG. 8, and thus these two steps will not be described further herein. As for the step 2406, it is performed for forming a first conductive glue layer 220 on the first conductive wiring layer 200, as shown in FIG. 11A, whereas, in an embodiment, the first conductive glue layer 220 can be formed by the use of a dispense process or a print process, and can be made of a metal, such as silver or tin, but is not limited thereby. The other steps that are performed in the method shown in FIG. 10 are described as following:

step 2408: forming a third conductive pillar layer 212 on the first conductive wiring layer 200, as shown in FIG. 11B, whereas the third conductive pillar layer 212 is formed using an electrolytic plating process in this embodiment, but is not limited thereby, and moreover, the third conductive pillar layer 212 can be made of a metal, such as copper and is formed at a position corresponding to the wires or the chip seat of the first conductive wiring layer 200;

step 2410: forming a fourth conductive pillar layer 214 on the third conductive pillar layer 212, as shown in FIG. 11C, whereas the fourth conductive pillar layer 214 is formed using an electrolytic plating process in this embodiment, but is not limited thereby, and moreover, the third conductive pillar layer 212 can be made of a metal, such as copper, and also the third conductive pillar layer 212 is formed with a line width that is larger than, smaller than or equal to the line width of the fourth conductive pillar layer according to actual requirements;

step 2412: providing an internal component 230 that is formed with a first electrode layer 232 and a second electrode layer 234 and thus is electrically connected to the first conductive glue layer 220 by the first electrode layer 232, as shown in FIG. 11D, whereas, in this embodiment, the internal component 232 is a component selected from the group consisting of: an active component, a passive component, and a semiconductor chip, and the first conductive glue layer 220 is composed of two conductive glues, and the first electrode layer 232 is composed of two electrodes, while the distance X between the centers of the two conductive glues is larger than, smaller than or equal to the distance Y between the centers of the electrodes, and in this embodiment, the distance X between the centers of the two conductive glues is larger than the distance Y between the centers of the electrodes, but is not limited thereby;

step 2414: forming a second conductive pillar layer 240 on the second electrode layer 234 of the internal component 230, as shown in FIG. 11E, whereas the second electrode layer 234 can be made of a metal, but is not limited thereby;

step 2416: forming a first molding compound layer 250 on the carrier 300 for allowing the same to cover the first conductive wiring layer 200, the first conductive glue layer 220, the third conductive pillar layer 212, the fourth conductive pillar layer 214, the internal component 230 and the second conductive pillar layer 240, as shown in FIG. 11F, whereas, the material of the first molding compound layer 250 as well as the process for forming the first molding compound layer 250 are the same as those shown in the first embodiment, but are not limited thereby;

step 2418: removing a portion of the first molding compound layer 250 for exposing the fourth conductive pillar layer 214 and the second conductive pillar layer 240, whereas under ideal condition, the exposed ends of the fourth conductive pillar layer 214 and the second conductive pillar layer 240 are positioned coplanar with the first molding compound layer 250, by that the exposing of the fourth conductive pillar layer 214 and the second conductive pillar layer 240 can be achieved simultaneously with the formation of the first molding compound layer 250, and thus the process for grinding and removing of the first molding compound layer 250 can be avoided; moreover, the removal of a portion of the first molding compound layer 250 in this embodiment can be performed in a manner similar to that of the first embodiment, but is not limited thereby;

step 2420: forming a second conductive wiring layer 260 on the fourth conductive pillar layer 214, the second conductive pillar layer 240 and the first molding compound layer 250, as shown in FIG. 11G, whereas the second conductive wiring layer 260 can be formed in a manner similar to that of the first embodiment, but is not limited thereby, and moreover, the second conductive wiring layer 260 can be a wiring layer with patterns which includes at least one wire or at least one chip seat and is a layer formed at a position corresponding to the exposed end of the fourth conductive pillar layer 214 or the exposed end of the second conductive pillar layer 240, moreover, the second conductive wiring layer 260 can be made of a metal, such as copper;

step 2422: removing the metal carrier 300 for exposing the wires and the chip seat of the first conductive wiring layer 200, as shown in FIG. 11H, whereas the removal of the metal carrier 300 can be performed in a manner similar to that of the first embodiment, but is not limited thereby.

Figure 12:
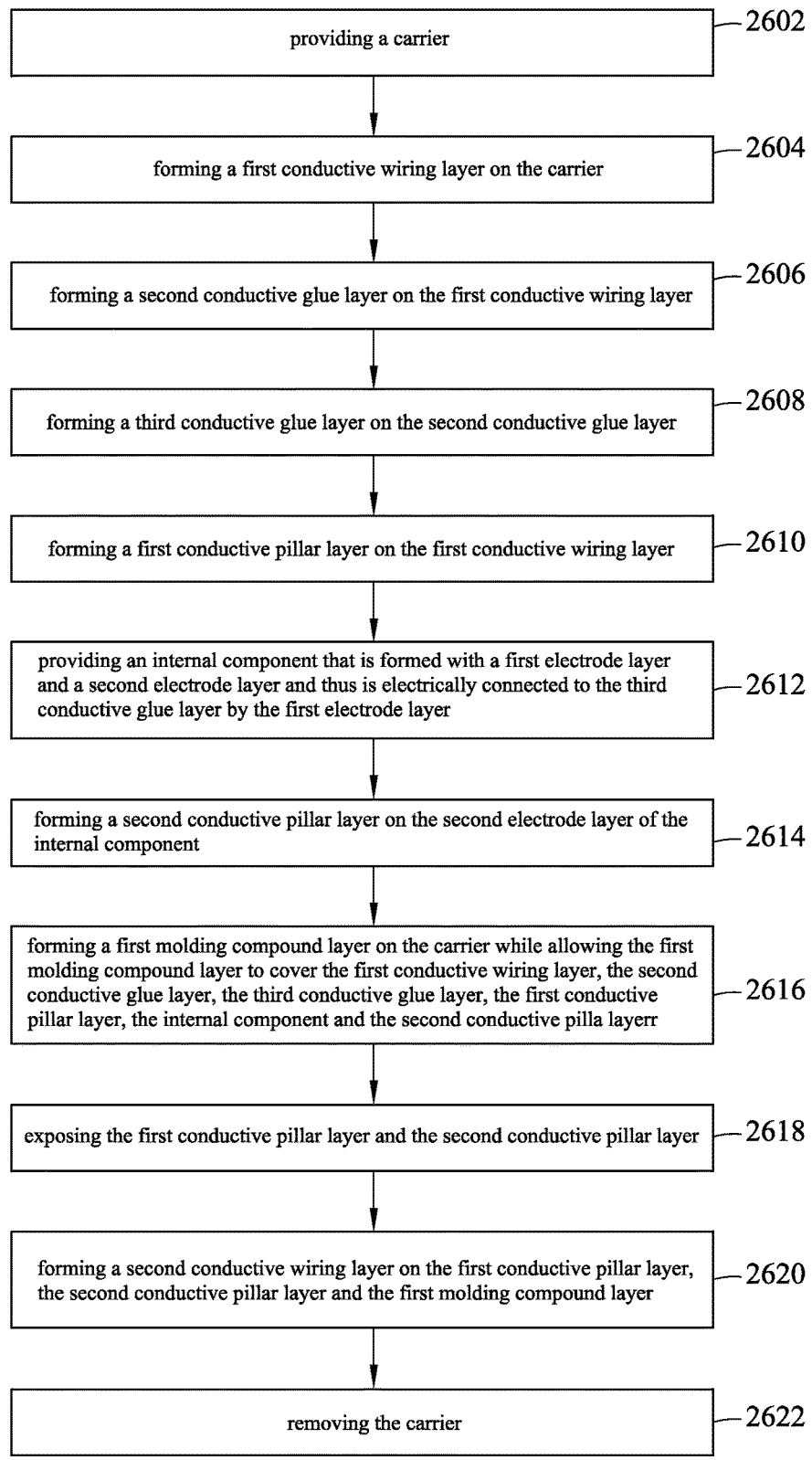
FIG. 12 is a flow chart depicting steps performing in a method for manufacturing a package apparatus of the fourth embodiment of the present invention.
Figure 13A:
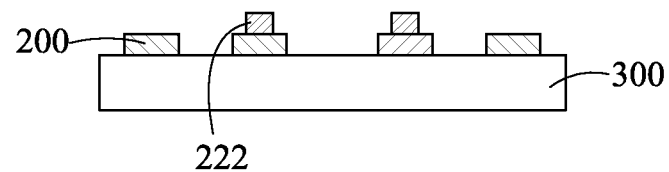
FIG. 13A to FIG. 13H are schematic diagrams illustrating the manufacturing of the package apparatus of the fourth embodiment.
Figure 13B:
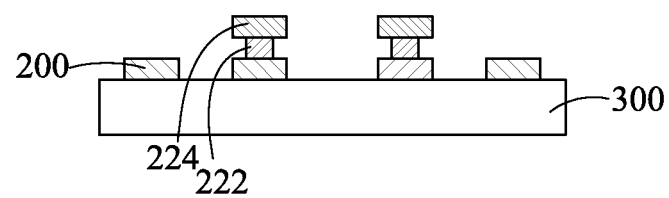
Figure 13C:
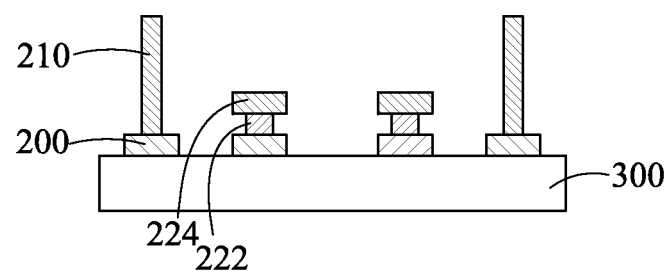
Figure 13D:
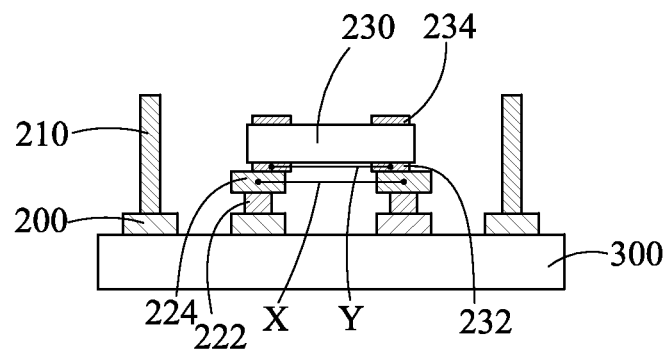
Figure 13E:
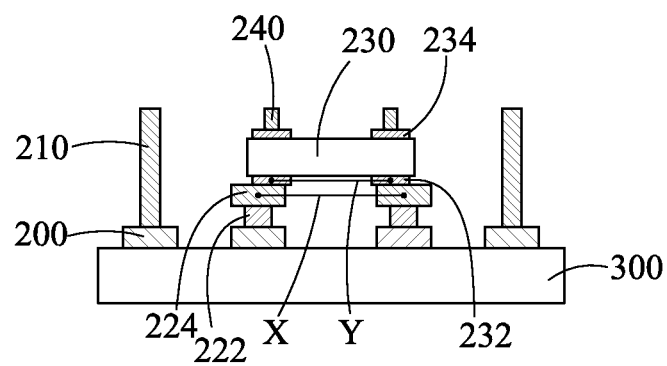
Figure 13F:
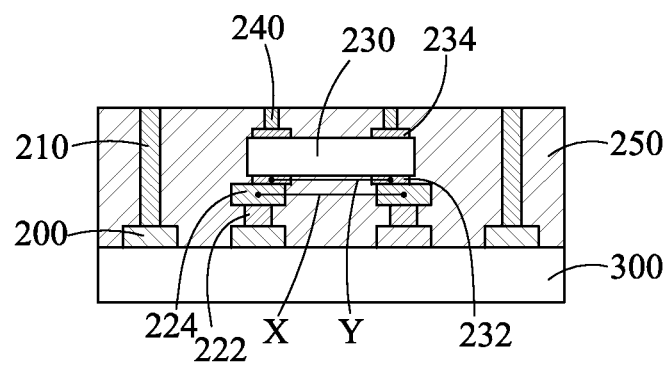
Figure 13G:
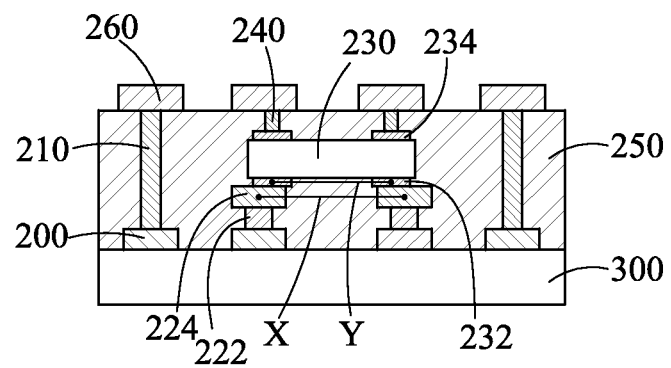
Figure 13H:
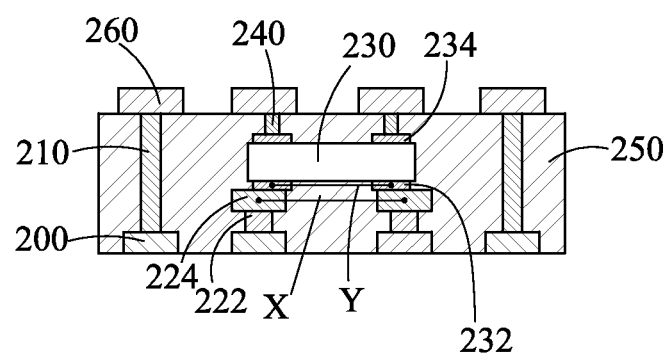

Please refer to FIG. 12, which is a flow chart depicting steps performing in a method for manufacturing a package apparatus of the fourth embodiment of the present invention, and also please refer to FIG. 13A to FIG. 13H, which are schematic diagrams illustrating the manufacturing of the package apparatus of the fourth embodiment. As shown in FIG. 12, the step 2602 for providing a carrier 300, and the step 2604 for forming a first conductive wiring layer are performed exactly the same as the step 2202 and the step 2204 that are shown in FIG. 8, and thus these two steps will not be described further herein. As for the step 2606, it is performed for forming a second conductive glue layer 222 on the first conductive wiring layer 200, as shown in FIG. 13A. The other steps that are performed in the method shown in FIG. 12 are described as following:

step 2608: forming a third conductive glue layer 224 on the second conductive glue layer 222, as shown in FIG. 13B, whereas, in this embodiment, each of the second conductive glue layer 222 and the third conductive glue layer 224 is formed using a dispense process or a print process, and can be made of a metal, such as silver or tin, but is not limited thereby; moreover, the second conductive glue layer 222 can be formed in a line width that is larger than, smaller than or equal to the line width of the third conductive glue layer 224;

step 2610: forming a first conductive pillar layer 210 on the first conductive wiring layer 200 at a position corresponding to the wires or the chip seat of the first conductive wiring layer 200, as shown in FIG. 13C, whereas the first conductive pillar layer 210 is formed using a method and material that are similar to those of the first embodiment, but is not limited thereby;

step 2612: providing an internal component 230 that is formed with a first electrode layer 232 and a second electrode layer 234 and thus is electrically connected to the third conductive glue layer 224 by the first electrode layer 232, as shown in FIG. 13D, whereas, in this embodiment, the internal component 232 is a component selected from the group consisting of: an active component, a passive component, and a semiconductor chip, and the third conductive glue layer 224 is composed of two conductive glues, and the first electrode layer 232 is composed of two electrodes, while the distance X between the centers of the two conductive glues is larger than, smaller than or equal to the distance Y between the centers of the electrodes, and in this embodiment, the distance X between the centers of the two conductive glues is larger than the distance Y between the centers of the electrodes, but is not limited thereby;

step 2614: forming a second conductive pillar layer 240 on the second electrode layer 234 of the internal component 230, as shown in FIG. 13E, whereas the second electrode layer 234 can be made of a metal, but is not limited thereby;

step 2616: forming a first molding compound layer 250 on the carrier 300 for allowing the same to cover the first conductive wiring layer 200, the second conductive glue layer 222, the third conductive glue layer 224, the first conductive pillar layer 210, the internal component 230 and the second conductive pillar layer 240, as shown in FIG. 13F, whereas, the material of the first molding compound layer 250 as well as the process for forming the first molding compound layer 250 are the same as those shown in the first embodiment, but are not limited thereby;

step 2218: removing a portion of the first molding compound layer 250 for exposing the first conductive pillar layer 210 and the second conductive pillar layer 240, whereas under ideal condition, the exposed ends of the first conductive pillar layer 210 and the second conductive pillar layer 240 are positioned coplanar with the first molding compound layer 250, by that the exposing of the first conductive pillar layer 210 and the second conductive pillar layer 240 can be achieved simultaneously with the formation of the first molding compound layer 250, and thus the process for grinding and removing of the first molding compound layer 250 can be avoided; moreover, the removal of a portion of the first molding compound layer 250 in this embodiment can be performed in a manner similar to that of the first embodiment, but is not limited thereby;

step 2620: forming a second conductive wiring layer 260 on the first conductive pillar layer 210, the second conductive pillar layer 240 and the first molding compound layer 250, as shown in FIG. 13G, whereas the second conductive wiring layer 260 can be formed in a manner similar to that of the first embodiment, but is not limited thereby, and moreover, the second conductive wiring layer 260 can be a wiring layer with patterns which includes at least one wire or at least one chip seat and is a layer formed at a position corresponding to the exposed end of the first conductive pillar layer 210 or the exposed end of the second conductive pillar layer 240, moreover, the second conductive wiring layer 260 can be made of a metal, such as copper;

step 2622: removing the metal carrier 300 for exposing the wires and the chip seat of the first conductive wiring layer 200, as shown in FIG. 13H, whereas the removal of the metal carrier 300 can be performed in a manner similar to that of the first embodiment, but is not limited thereby.

Figure 14:
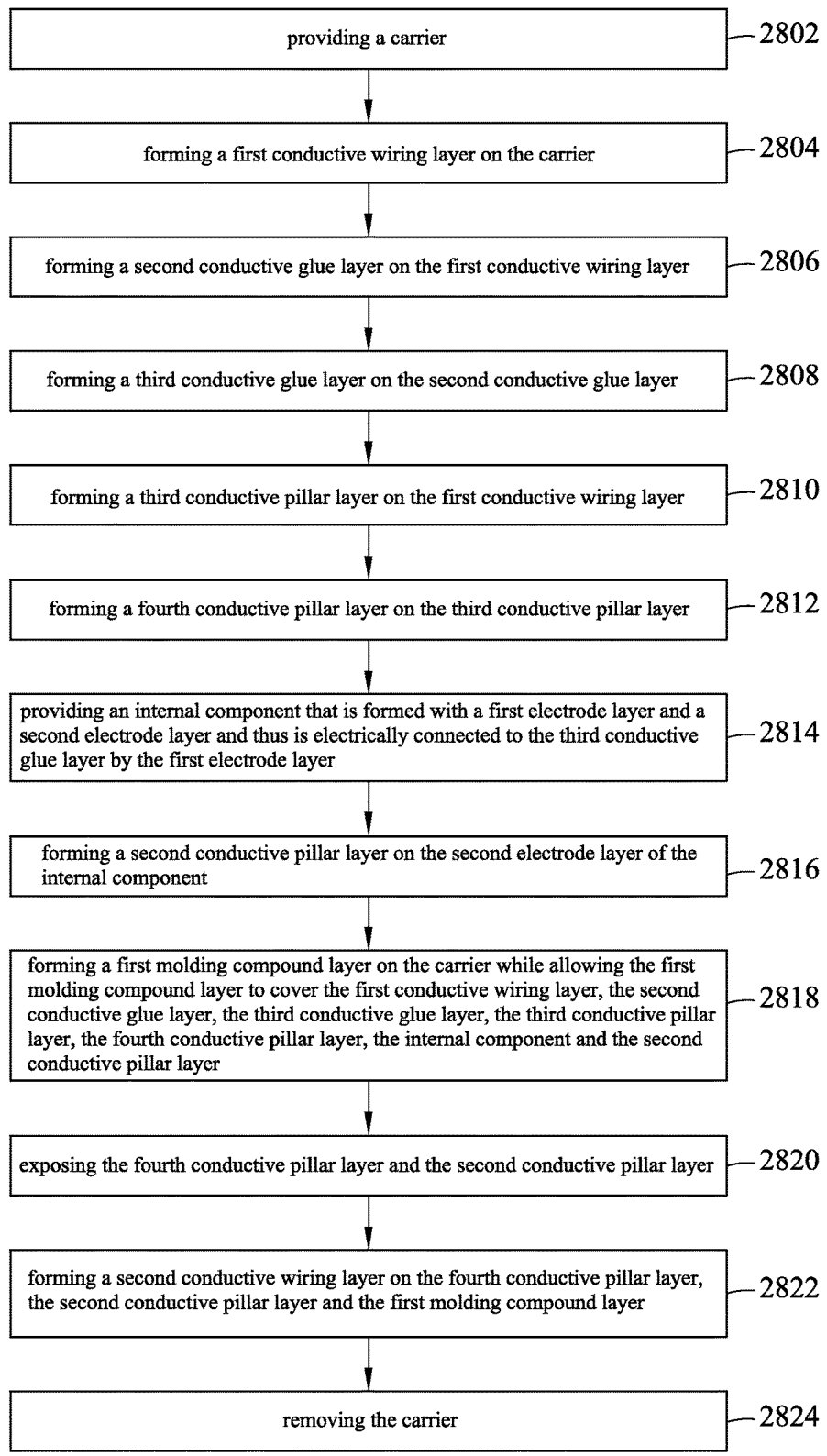
FIG. 14 is a flow chart depicting steps performing in a method for manufacturing a package apparatus of the fifth embodiment of the present invention.
Figure 15A:
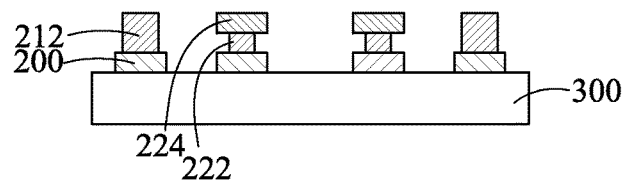
FIG. 15A to FIG. 15G are schematic diagrams illustrating the manufacturing of the package apparatus of the fifth embodiment.
Figure 15B:
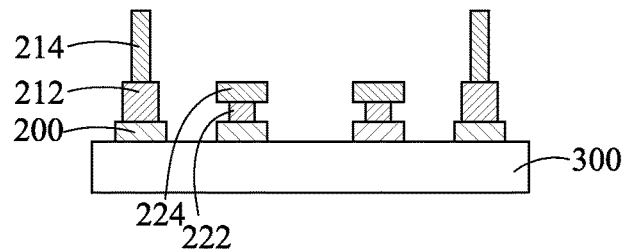
Figure 15C:
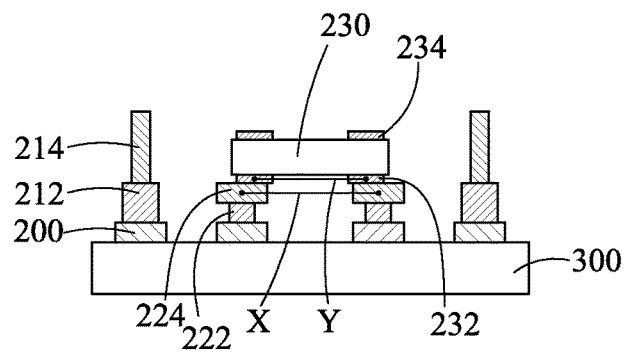
Figure 15D:
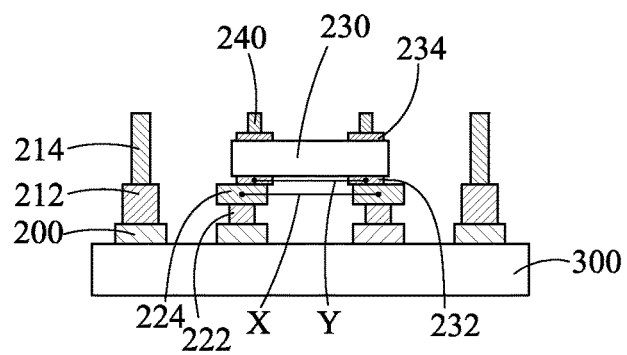
Figure 15E:
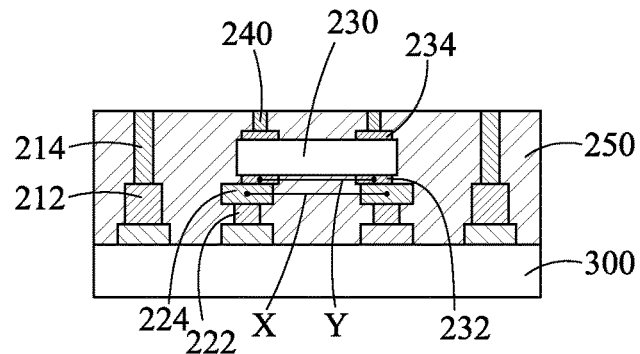
Figure 15F:
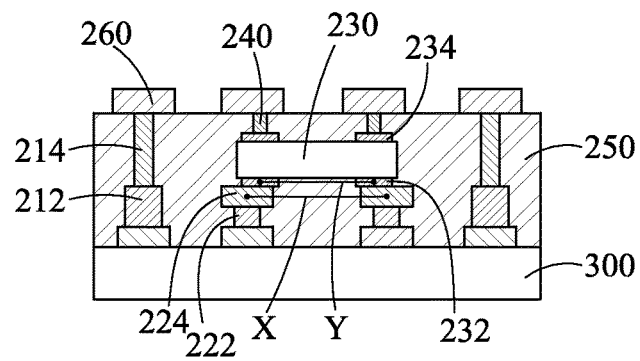
Figure 15G:
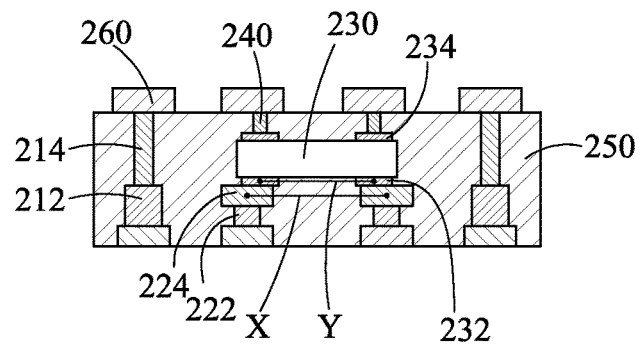

Please refer to FIG. 14, which is a flow chart depicting steps performing in a method for manufacturing a package apparatus of the fifth embodiment of the present invention, and also please refer to FIG. 15A to FIG. 15G, which are schematic diagrams illustrating the manufacturing of the package apparatus of the fifth embodiment. As shown in FIG. 14, the step 2802 for providing a carrier 300, the step 2804 for forming a first conductive wiring layer 200, the step 2806 for forming a second conductive glue layer 222, and the step 2808 for forming a third conductive glue layer 224 are performed exactly the same as the step 2602, 2604, 2606 and the step 2608 that are shown in FIG. 12, and thus these four steps will not be described further herein. The other steps that are performed in the method shown in FIG. 14 are described as following:

step 2810: forming a third conductive pillar layer 212 on the first conductive wiring layer 200, as shown in FIG. 15A, whereas the third conductive pillar layer 212 is formed using an electrolytic plating process in this embodiment, but is not limited thereby, and moreover, the third conductive pillar layer 212 can be made of a metal, such as copper and is formed at a position corresponding to the wires or the chip seat of the first conductive wiring layer 200;

step 2812: forming a fourth conductive pillar layer 214 on the third conductive pillar layer 212, as shown in FIG. 15B; whereas the fourth conductive pillar layer 214 is formed using an electrolytic plating process in this embodiment, but is not limited thereby, and moreover, the fourth conductive pillar layer 214 can be made of a metal, such as copper, and is formed with a line width that is larger than, smaller than or equal to the line width of the third conductive pillar layer 212 according to actual requirements;

step 2814: providing an internal component 230 that is formed with a first electrode layer 232 and a second electrode layer 234 and thus is electrically connected to the third conductive glue layer 224 by the first electrode layer 232, as shown in FIG. 15C, whereas, in this embodiment, the internal component 232 is a component selected from the group consisting of: an active component, a passive component, and a semiconductor chip, while the third conductive glue layer 224 is composed of two conductive glues, and the first electrode layer 232 is composed of two electrodes, while the distance X between the centers of the two conductive glues is larger than, smaller than or equal to the distance Y between the centers of the electrodes, and in this embodiment, the distance X between the centers of the two conductive glues is larger than the distance Y between the centers of the electrodes, but is not limited thereby;

step 2816: forming a second conductive pillar layer 240 on the second electrode layer 234 of the internal component 230, as shown in FIG. 15D, whereas the second electrode layer 234 can be made of a metal, but is not limited thereby;

step 2818: forming a first molding compound layer 250 on the carrier 300 for allowing the same to cover the first conductive wiring layer 200, the second conductive glue layer 222, the third conductive glue layer 224, the third conductive pillar layer 212, the fourth conductive pillar layer 214, the internal component 230 and the second conductive pillar layer 240, as shown in FIG. 15E, whereas, the material of the first molding compound layer 250 as well as the process for forming the first molding compound layer 250 are the same as those shown in the first embodiment, but are not limited thereby;

step 2820: removing a portion of the first molding compound layer 250 for exposing the fourth conductive pillar layer 214 and the second conductive pillar layer 240, whereas under ideal condition, the exposed ends of the fourth conductive pillar layer 214 and the second conductive pillar layer 240 are positioned coplanar with the first molding compound layer 250, by that the exposing of the fourth conductive pillar layer 214 and the second conductive pillar layer 240 can be achieved simultaneously with the formation of the first molding compound layer 250, and thus the process for grinding and removing of the first molding compound layer 250 can be avoided; moreover, the removal of a portion of the first molding compound layer 250 in this embodiment can be performed in a manner similar to that of the first embodiment, but is not limited thereby;

step 2822: forming a second conductive wiring layer 260 on the fourth conductive pillar layer 214, the second conductive pillar layer 240 and the first molding compound layer 250, as shown in FIG. 15F, whereas the second conductive wiring layer 260 can be a wiring layer with patterns which includes at least one wire or at least one chip seat and is a layer formed at a position corresponding to the exposed end of the first conductive pillar layer 210 or the exposed end of the second conductive pillar layer 240, moreover, the second conductive wiring layer 260 can be made of a metal, such as copper;

step 2824: removing the metal carrier 300 for exposing the wires and the chip seat of the first conductive wiring layer 200, as shown in FIG. 15G, whereas the removal of the metal carrier 300 can be performed in a manner similar to that of the first embodiment, but is not limited thereby.

Figure 16:
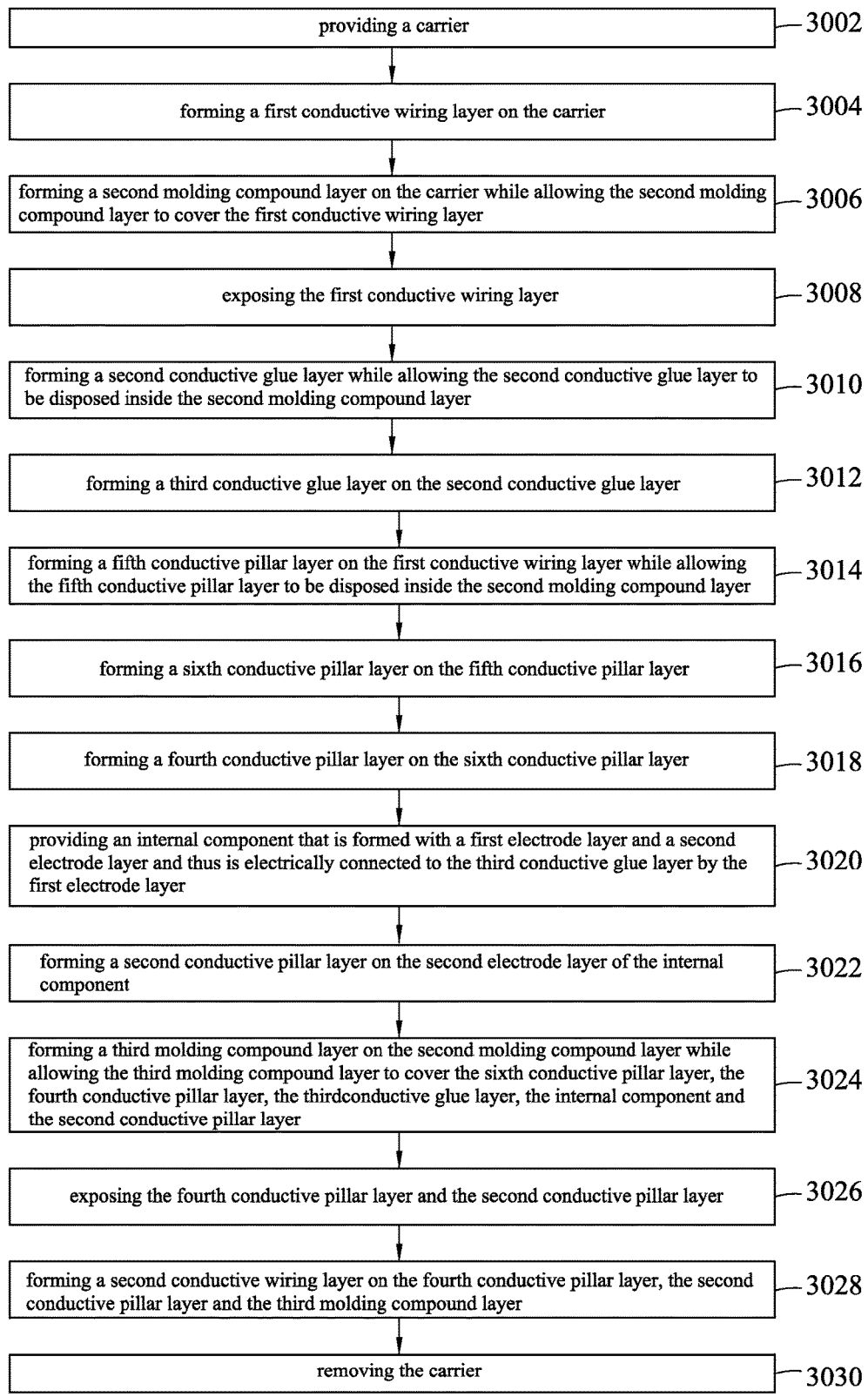
FIG. 16 is a flow chart depicting steps performing in a method for manufacturing a package apparatus of the sixth embodiment of the present invention.
Figure 17A:
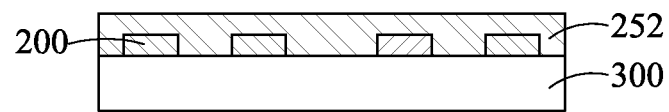
FIG. 17A to FIG. 17L are schematic diagrams illustrating the manufacturing of the package apparatus of the sixth embodiment.
Figure 17B:
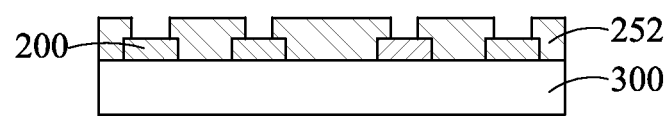
Figure 17C:
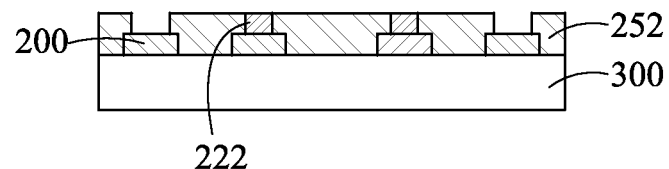
Figure 17D:
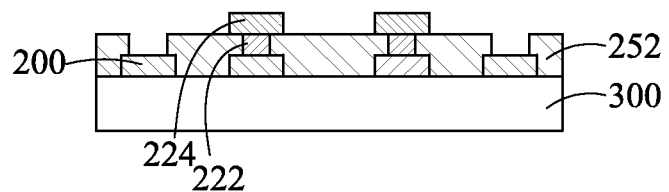
Figure 17E:
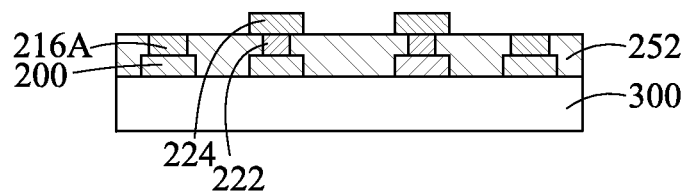
Figure 17F:
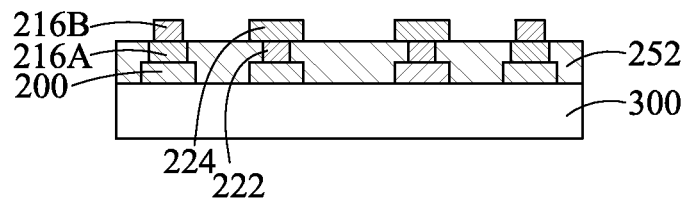
Figure 17G:
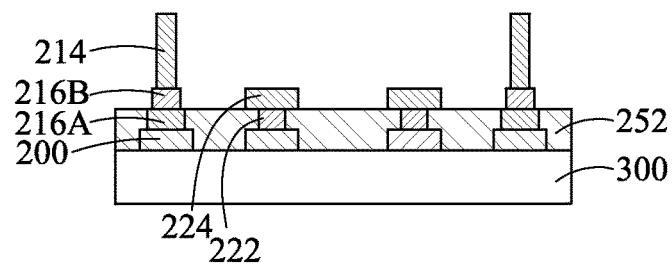
Figure 17H:
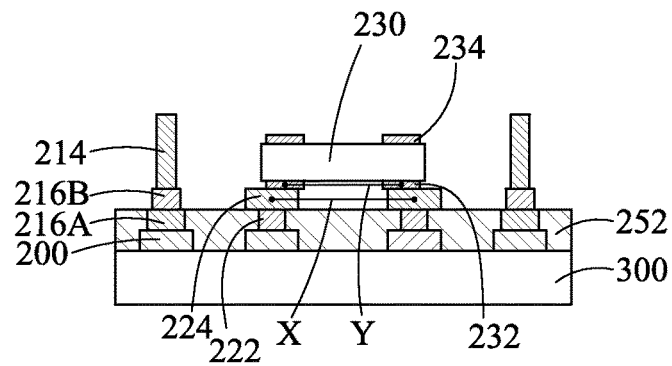
Figure 17I:
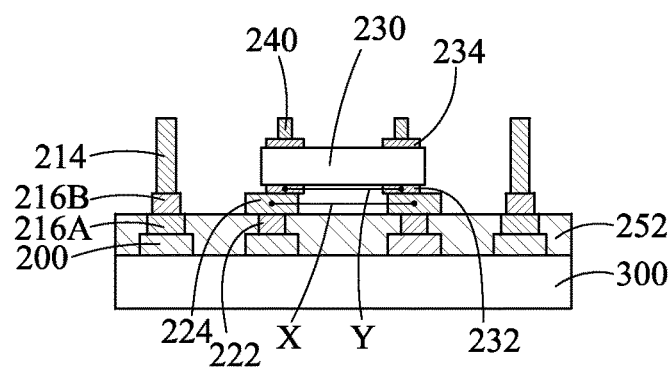
Figure 17J:
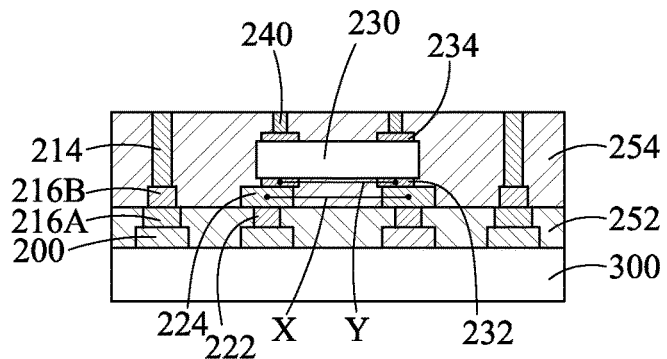
Figure 17K:
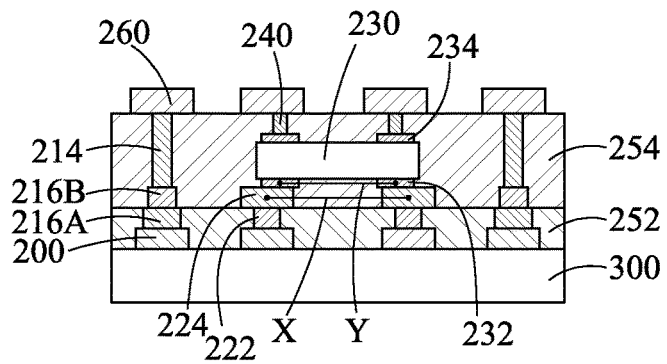
Figure 17L:
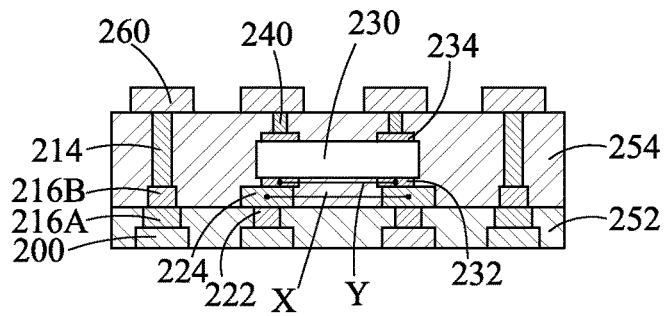

Please refer to FIG. 16, which is a flow chart depicting steps performing in a method for manufacturing a package apparatus of the sixth embodiment of the present invention, and also please refer to FIG. 17A to FIG. 17L, which are schematic diagrams illustrating the manufacturing of the package apparatus of the sixth embodiment. As shown in FIG. 16, the step 3002 for providing a carrier 300 and the step 3004 for forming a first conductive wiring layer 200 are performed exactly the same as the step 2202 and the step 2204 that are shown in the first embodiment, and thus these four steps will not be described further herein. The other steps that are performed in the method shown in FIG. 16 are described as following:

step 3006: forming a second molding compound layer 252 on the carrier while allowing the second molding compound layer 252 to cover the first conductive wiring layer 200, as shown in FIG. 17A, whereas the formation of the second molding compound layer 252 can be performed by a process the same as that of the first molding compound layer 250, but is not limited thereby;

step 3008: exposing the first conductive wiring layer 200, as shown in FIG. 17B, whereas, in this embodiment, the first conductive wiring layer is exposed by the proceeding of a pumice process or a laser via process for removing a portion of the second molding compound layer 252, but in another embodiment, the exposing of the first conductive wiring layer 200 can be enabled and ensured during the formation of the second molding compound layer 252 without removing any portion of the second molding compound layer 252;

step 3010: forming a second conductive glue layer 222 on the first conductive wiring layer 200 while allowing the second conductive glue layer 222 to be disposed inside the second molding compound layer 252, as shown in FIG. 17C, whereas the second conductive glue layer 222 is formed using a dispense process or a print process, and can be made of a metal, such as silver, or tin, but is not limited thereby;

step 3012: forming a third conductive glue layer 224 on the second conductive glue layer 222, as shown in FIG. 17D, whereas the third conductive glue layer 224 can be formed in a line width that is larger than, smaller than or equal to the line width of the second conductive glue layer 222, and in this embodiment, the third conductive glue layer 224 can be formed simultaneously on the second conductive glue layer 222 and the second molding compound layer 252, but is not limited thereby, and moreover, the third conductive glue layer 224 is formed using a dispense process or a print process, and can be made of a metal, such as silver, or tin, but is not limited thereby;

step 3014: forming a fifth conductive pillar layer 216A at a position corresponding to the wiring or chip seat of the first conductive wiring layer 200 while allowing the fifth conductive pillar layer 216A to be disposed inside the second molding compound layer 252, as shown in FIG. 17E;

step 3016: forming a sixth conductive pillar layer 216B on the fifth conductive pillar layer 216A, as shown in FIG. 17F, whereas the fifth conductive pillar layer 216A can be formed in a line width that is larger than, smaller than or equal to the line width of the sixth conductive pillar layer 216B;

step 3018: forming a fourth conductive pillar layer 214 on the sixth conductive pillar layer 216B, as shown in FIG. 17G, whereas, in this embodiment, the fourth conductive pillar layer 214, the fifth conductive pillar layer 216A and the sixth conductive pillar layer 216B can also be formed by the use of an electrolytic plating process, but is not limited thereby, and moreover, each of the fourth conductive pillar layer 214, the fifth conductive pillar layer 216A and the sixth conductive pillar layer 216B can be made of a metal, such as copper, and also the fourth conductive pillar layer 214, the fifth conductive pillar layer 216A and the sixth conductive pillar layer 216B can be formed with equal line widths or unequal line widths;

step 3020: providing an internal component 230 that is formed with a first electrode layer 232 and a second electrode layer 234 and thus is electrically connected to the third conductive glue layer 224 by the first electrode layer 232, as shown in FIG. 17H, whereas, in this embodiment, the internal component 232 is a component selected from the group consisting of: an active component, a passive component, and a semiconductor chip, while the third conductive glue layer 224 is composed of two conductive glues, and the first electrode layer 232 is composed of two electrodes, while the distance X between the centers of the two conductive glues is larger than, smaller than or equal to the distance Y between the centers of the electrodes, and in this embodiment, the distance X between the centers of the two conductive glues is larger than the distance Y between the centers of the electrodes, but is not limited thereby;

step 3022: forming a second conductive pillar layer 240 on the second electrode layer 234 of the internal component 230, as shown in FIG. 17I, whereas the second electrode layer 234 can be made of a metal, but is not limited thereby;

step 3024: forming a third molding compound layer 254 on the second molding compound layer 252 for allowing the same to cover the sixth conductive wiring layer 216B, the fourth conductive pillar layer 214, the third conductive glue layer 224, the internal component 230 and the second conductive pillar layer 240, as shown in FIG. 17J, whereas, the material of the third molding compound layer 254 as well as the process for forming the third molding compound layer 254 are the same as those shown in the aforesaid embodiments, but are not limited thereby;

step 3026: removing a portion of the third molding compound layer 254 for exposing the fourth conductive pillar layer 214 and the second conductive pillar layer 240, whereas under ideal condition, the exposed ends of the fourth conductive pillar layer 214 and the second conductive pillar layer 240 are positioned coplanar with the third molding compound layer 254, by that the exposing of the fourth conductive pillar layer 214 and the second conductive pillar layer 240 can be achieved simultaneously with the formation of the third molding compound layer 254, and thus the process for grinding and removing of the third molding compound layer 254 can be avoided; moreover, the removal of a portion of the third molding compound layer 254 in this embodiment can be performed in a manner similar to that of the first embodiment, but is not limited thereby;

step 3028: forming a second conductive wiring layer 260 on the fourth conductive pillar layer 214, the second conductive pillar layer 240 and the third molding compound layer 254, as shown in FIG. 17K, whereas the second conductive wiring layer 260 can be a wiring layer with patterns which includes at least one wire or at least one chip seat and is a layer formed at a position corresponding to the exposed end of the fourth conductive pillar layer 214 or the exposed end of the second conductive pillar layer 240, moreover, the second conductive wiring layer 260 can be made of a metal, such as copper;

step 3030: removing the metal carrier 300 for exposing the wires and the chip seat of the first conductive wiring layer 200, as shown in FIG. 17L, whereas the removal of the metal carrier 300 can be performed in a manner similar to that of the aforesaid embodiments, but is not limited thereby.

Figure 18:
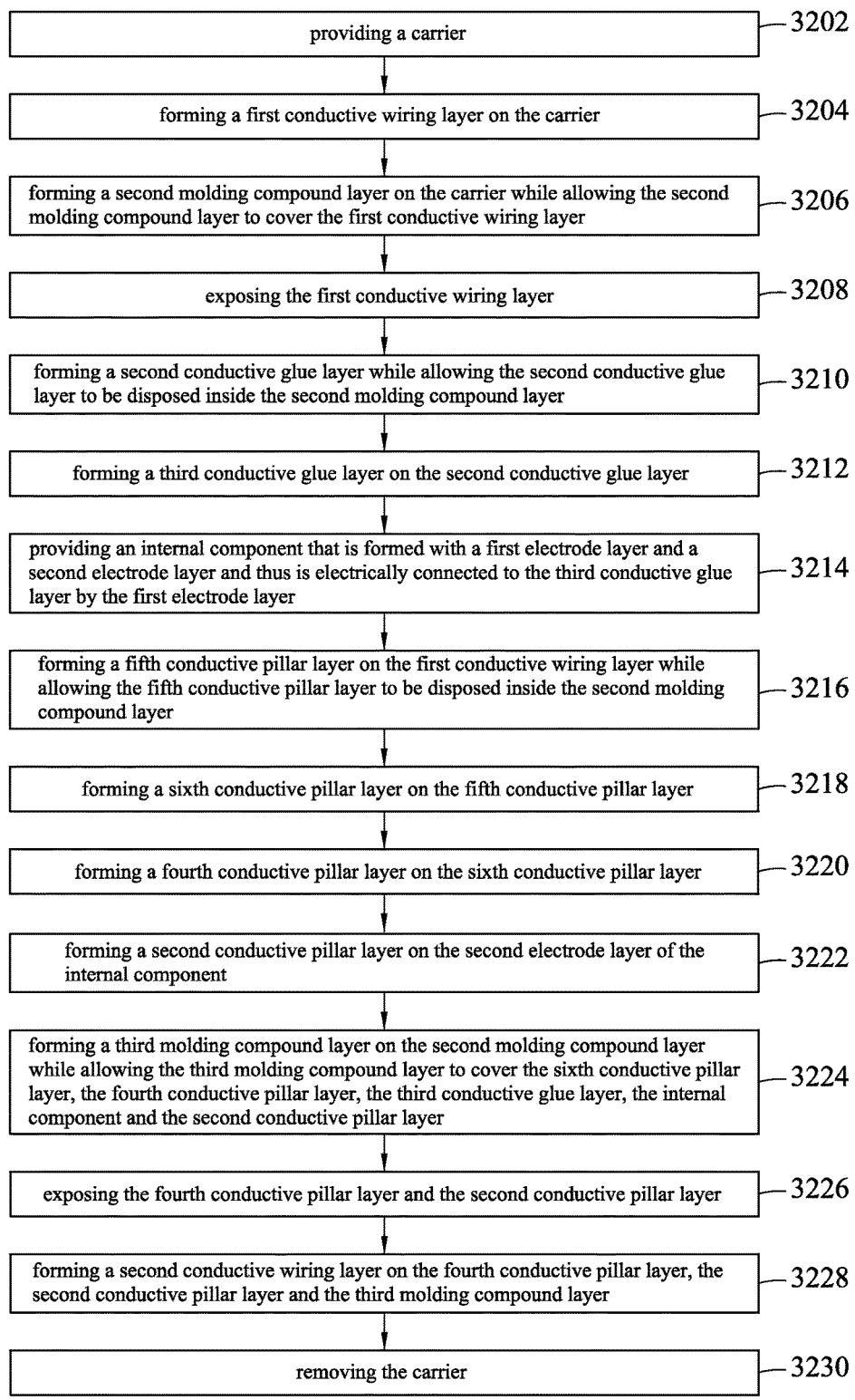
FIG. 18 is a flow chart depicting steps performing in a method for manufacturing a package apparatus of a seventh embodiment of the present invention.
Figure 19A:
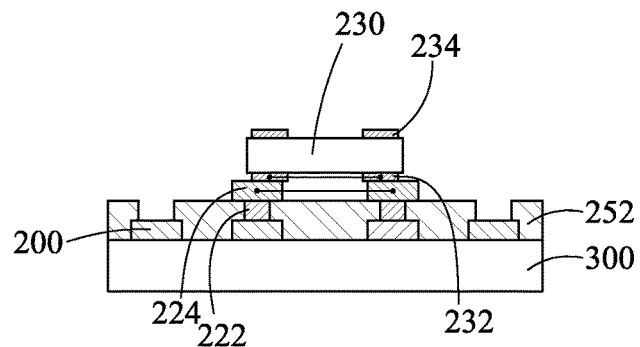
FIG. 19A to FIG. 19D are schematic diagrams illustrating the manufacturing of the package apparatus of the seventh embodiment.
Figure 19B:
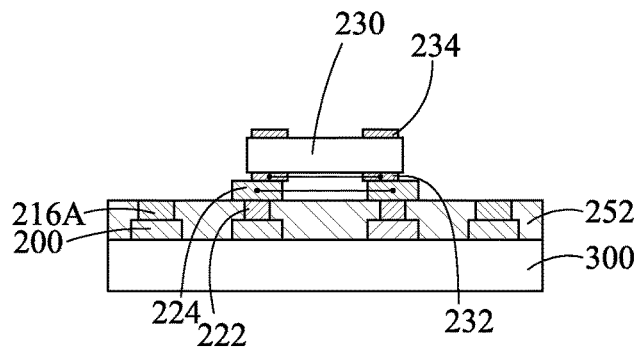
Figure 19C:
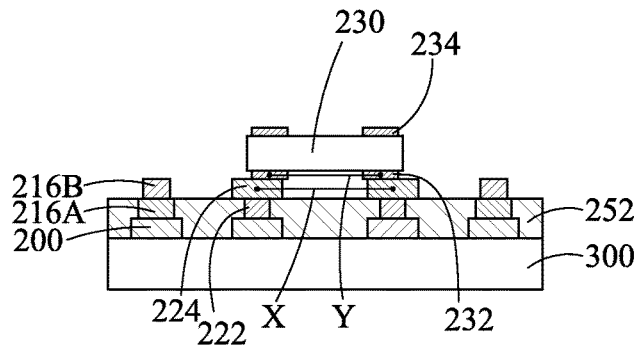
Figure 19D:
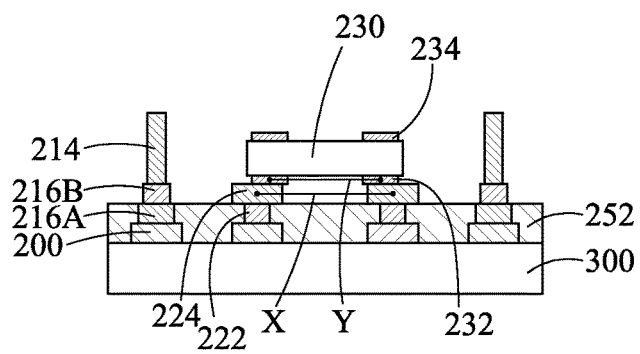

Please refer to FIG. 18, which is a flow chart depicting steps performing in a method for manufacturing a package apparatus of the seventh embodiment of the present invention, and also please refer to FIG. 19A to FIG. 19D, which are schematic diagrams illustrating the manufacturing of the package apparatus of the seventh embodiment. As shown in FIG. 18, the step 3202 for providing a carrier 300, the step 3204 for forming a first conductive wiring layer 200, the step 3206 for forming a second molding compound layer 252, the step 3208 for exposing the first conductive wiring layer 200, the step 3210 for forming a second conductive glue layer 222, and the step 3212 for forming a third conductive glue layer 224 are performed exactly the same as the step 3002, 3004, 3006, 3008, 3010 and the step 3012 that are shown in FIG. 16, and thus these six steps will not be described further herein. The other steps that are performed in the method shown in FIG. 18 are described as following:

step 3214: providing an internal component 230 that is formed with a first electrode layer 232 and a second electrode layer 234 and thus is electrically connected to the third conductive glue layer 224 by the first electrode layer 232, as shown in FIG. 19A, whereas, in this embodiment, the internal component 232 is a component selected from the group consisting of: an active component, a passive component, and a semiconductor chip, while the third conductive glue layer 224 is composed of two conductive glues, and the first electrode layer 232 is composed of two electrodes, while the distance X between the centers of the two conductive glues is larger than, smaller than or equal to the distance Y between the centers of the electrodes, and in this embodiment, the distance X between the centers of the two conductive glues is larger than the distance Y between the centers of the electrodes, but is not limited thereby;

step 3216: forming a fifth conductive pillar layer 216A at a position corresponding to the wiring or chip seat of the first conductive wiring layer 200 while allowing the fifth conductive pillar layer 216A to be disposed inside the second molding compound layer 252, as shown in FIG. 19B;

step 3218: forming a sixth conductive pillar layer 216B on the fifth conductive pillar layer 216A, as shown in FIG. 19C, whereas the fifth conductive pillar layer 216A can be formed in a line width that is larger than, smaller than or equal to the line width of the sixth conductive pillar layer 216B;

step 3220: forming a fourth conductive pillar layer 214 on the sixth conductive pillar layer 216B, as shown in FIG. 19D, whereas, in this embodiment, the fourth conductive pillar layer 214, the fifth conductive pillar layer 216A and the sixth conductive pillar layer 216B can also be formed by the use of an electrolytic plating process, but is not limited thereby, and moreover, each of the fourth conductive pillar layer 214, the fifth conductive pillar layer 216A and the sixth conductive pillar layer 216B can be made of a metal, such as copper, and also the fourth conductive pillar layer 214, the fifth conductive pillar layer 216A and the sixth conductive pillar layer 216B can be formed with equal line widths or unequal line widths;

step 3222~step 3230: being performed in a way similar to the step 3022~step 3030 that will not be described further herein.

Figure 20:
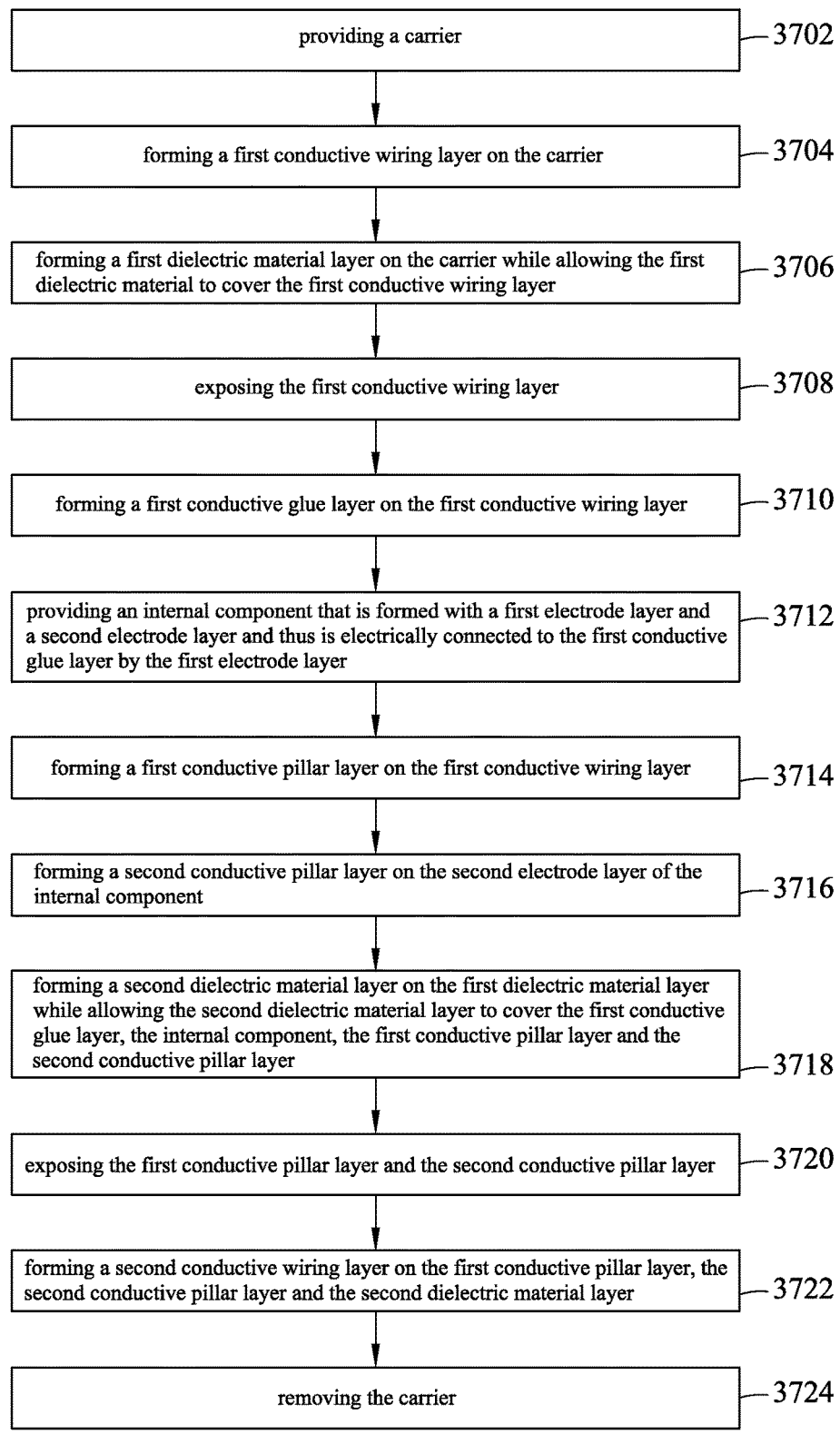
FIG. 20 is a flow chart depicting steps performing in a method for manufacturing a package apparatus of an eighth embodiment of the present invention.

Please refer to FIG. 20, which is a flow chart depicting steps performing in a method for manufacturing a package apparatus of an eighth embodiment of the present invention. Please refer to FIG. 21A to FIG. 21I, which are schematic diagrams illustrating the manufacturing of the package apparatus of the eighth embodiment. In this eighth embodiment, a package apparatus is disclosed, which comprises: a first conductive wiring layer 200; a first dielectric material layer 270, disposed covering the first conductive wiring layer 200; a first conductive glue layer 220, disposed on the first conductive wiring layer 200; an internal component 230, composed of a first electrode layer 232 and a second electrode layer 234 in a manner that the first electrode layer 232 is disposed and electrically connected to the first conductive glue layer 220; a first conductive pillar layer 210, disposed on the first conductive wiring layer 200; a second conductive pillar layer 240, disposed on the second electrode layer 234 of the internal component 230; a second dielectric material layer 272, disposed on the first dielectric material layer 270; and a second conductive wiring layer 260, disposed on the first conductive pillar layer 210, the second conductive pillar layer 240, and the second dielectric material layer 272. In this embodiment, the first conductive glue layer 220 can be formed by a dispense process or a print process, but is not limited thereby. Moreover, the internal component 230 can be a component selected from the group consisting of: an active component, a passive component, and a semiconductor chip; the first conductive glue layer 220, the internal component 230, the first conductive pillar layer 210 and the second conductive pillar layer 240 can be disposed inside the second dielectric material layer 272, whereas the first dielectric material layer 270 and the second dielectric material layer can be made of a material selected from the group consisting of: a resin, a silicon nitride material and a silicon oxide material, but is not limited thereby. Similarly, each of the first conductive wiring layer 200 and the second conductive wiring layer 260 includes at least one wire or at least one chip seat, but is also not limited thereby.

In addition, the first conductive glue layer 220 is composed of two conductive glues, and the first electrode layer 232 is composed of two electrodes, while the distance X between the centers of the two conductive glues is larger than, smaller than or equal to the distance Y between the centers of the electrodes, which can be determined according to actual requirements.

Figure 21A:
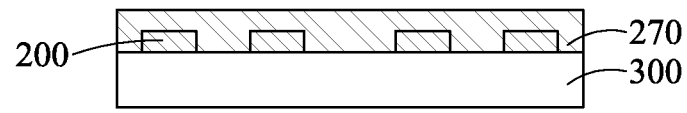
FIG. 21A to FIG. 21I are schematic diagrams illustrating the manufacturing of the package apparatus of the eighth embodiment.
Figure 21B:
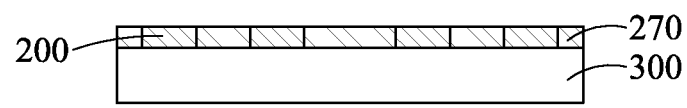
Figure 21C:
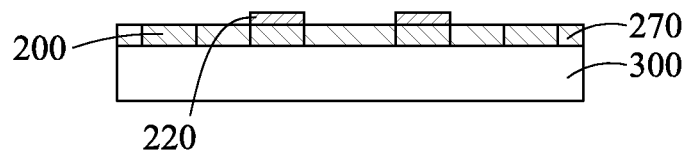
Figure 21D:
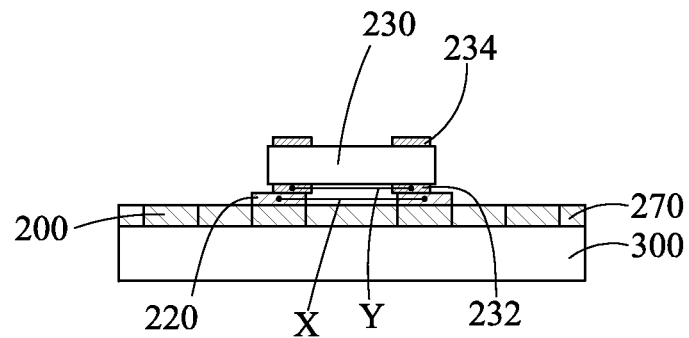
Figure 21E:
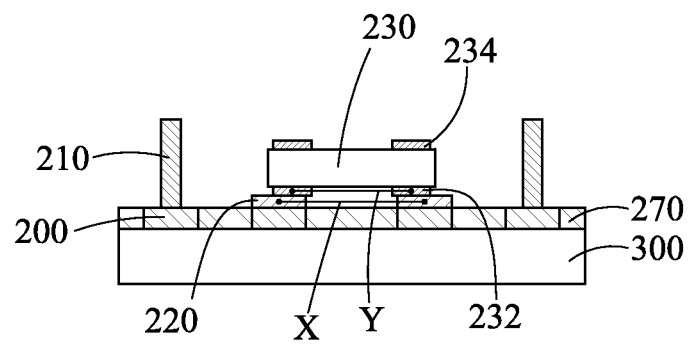
Figure 21F:
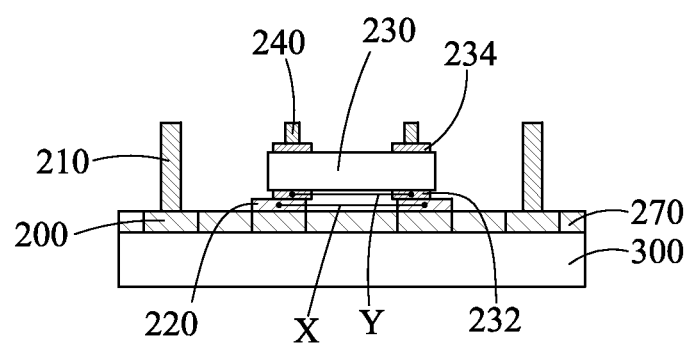
Figure 21G:
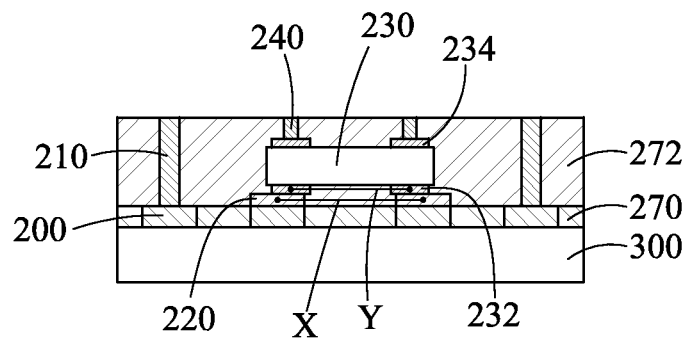
Figure 21H:
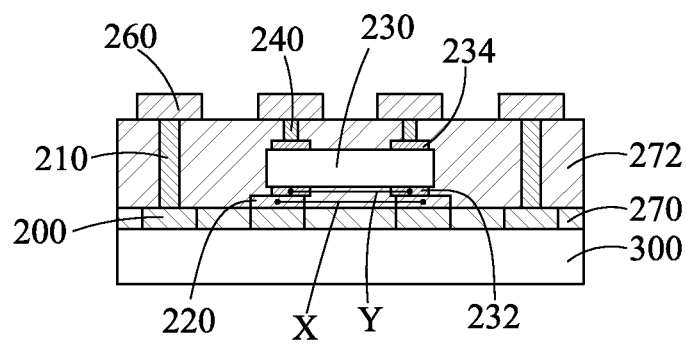
Figure 21I:
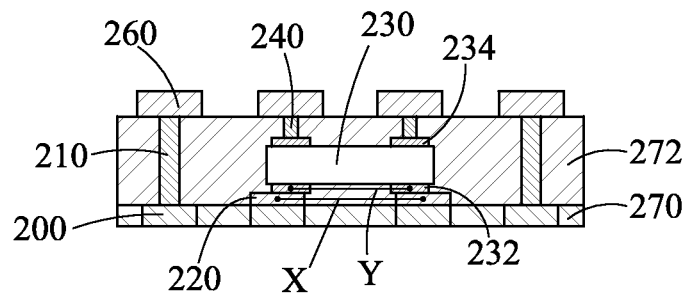

As shown in FIG. 20, the step for providing a carrier 300 and the step for forming a first conductive wiring layer 200 are performed the same as the steps 2202, 2204 shown in the first embodiment, and thus will not be described further herein. The other steps that are performed in the method shown in FIG. 20 are described as following:

step 3706: forming a first dielectric material layer 270 on the carrier 300 while allowing the same to cover the first conductive can be made of a material selected from the group consisting of: a resin, a silicon nitride material and a silicon oxide material, but is not limited thereby wiring layer 200, as shown in FIG. 21A, whereas, in this embodiment, the first dielectric material layer 270 can be made of a material selected from the group consisting of: a resin, a silicon nitride material and a silicon oxide material, but is not limited thereby;

step 3708: exposing the first conductive wiring layer 200, as shown in FIG. 21B, whereas, in this embodiment, the first conductive wiring layer is exposed by the proceeding of a pumice process or a laser via process for removing a portion of the first dielectric material layer 270, but in another embodiment, the exposing of the first conductive wiring layer 200 can be enabled and ensured during the formation of the first dielectric material layer 270 without removing any portion of the first dielectric material layer 270;

step 3710: forming a first conductive glue layer 220 on the first conductive wiring layer 200, as shown in FIG. 21C, whereas the first conductive glue layer 220 is formed using a dispense process or a print process, and can be made of a metal, such as silver, or tin, but is not limited thereby;

step 3712: providing an internal component 230 that is formed with a first electrode layer 232 and a second electrode layer 234 and thus is electrically connected to the first conductive glue layer 220 by the first electrode layer 232, as shown in FIG. 21D, whereas, in this embodiment, the internal component 232 is a component selected from the group consisting of: an active component, a passive component, and a semiconductor chip, while the first conductive glue layer 220 is composed of two conductive glues, and the first electrode layer 232 is composed of two electrodes, while the distance X between the centers of the two conductive glues is larger than, smaller than or equal to the distance Y between the centers of the electrodes, and in this embodiment, the distance X between the centers of the two conductive glues is larger than the distance Y between the centers of the electrodes, but is not limited thereby;

step 3714: forming a first conductive pillar layer 210 on the first conductive wiring layer 200, as shown in FIG. 21E, whereas the first conductive pillar layer 210 is formed using an electrolytic plating process in this embodiment, but is not limited thereby, and moreover, the first conductive pillar layer 220 can be made of a metal, such as copper and is formed at a position corresponding to the wires or the chip seat of the first conductive wiring layer 200;

step 3716: forming a second conductive pillar layer 240 on the second electrode layer 234 of the internal component 230, as shown in FIG. 21F, whereas the second electrode layer 234 can be made of a metal, but is not limited thereby;

step 3718: forming a second dielectric material layer 272 on the first dielectric material layer 270 for allowing the same to cover the first conductive glue layer 220, the internal component 230, the first conductive pillar layer 210 and the second conductive pillar layer 240, as shown in FIG. 21G, whereas, the second dielectric material layer 272 can be made of a material selected from the group consisting of: a resin, a silicon nitride material and a silicon oxide material, but is not limited thereby;

step 3720: enabling one end of each of the first conductive pillar layer 210 and the second conductive pillar layer 240 to be exposed, whereas in this embodiment, the exposing of the first conductive pillar layer 210 and the second conductive pillar layer 240 is enabled by grinding and removing a portion of the second dielectric material layer 272, however, under ideal condition, the exposed ends of the first conductive pillar layer 210 and the second conductive pillar layer 240 are positioned coplanar with the second dielectric material layer 272, by that the exposing of the first conductive pillar layer 210 and the second conductive pillar layer 240 can be achieved simultaneously with the formation of the second dielectric material layer 272, and thus the process for grinding and removing of the second dielectric material layer 272 can be avoided;

step 3722: forming a second conductive wiring layer 260 on the first conductive pillar layer 210, the second conductive pillar layer 240 and the second dielectric material layer 272, as shown in FIG. 21H, whereas the second conductive wiring layer 260 can be formed by the use of an electrolytic plating process, an electroless plating process, a sputtering coating process, or a thermal coating process, but is not limited thereby, and moreover, the second conductive wiring layer 260 can be a wiring layer with patterns which includes at least one wire or at least one chip seat and is a layer formed at a position corresponding to the exposed end of the first conductive pillar layer 210 or the exposed end of the second conductive pillar layer 240, moreover, the second conductive wiring layer 260 can be made of a metal, such as copper;

step 3724: removing the metal carrier 300 for exposing the wires and the chip seat of the first conductive wiring layer 200, as shown in FIG. 9I, whereas the removal of the metal carrier 300 can be performed using an etching process, or a debonding process, or even a physical process of grinding, but is not limited thereby;

As described in the second embodiment, the first conductive pillar layer 210 in this eighth embodiment can be replaced by a composition of a third conductive pillar layer 212 and a fourth conductive pillar layer 214. Furthermore, as described in the third embodiment, the third conductive pillar layer 210 can further be replaced by a composition of a fifth conductive pillar layer 216A and a sixth conductive pillar layer 216B. Similarly, the third conductive pillar layer 212, the fourth conductive pillar layer 214, the fifth conductive pillar layer 216A, and the sixth conductive pillar layer 216B can be formed in equal line widths or unequal line widths. In addition, as described in the fourth embodiment, the first conductive glue layer 220 in this eighth embodiment can be replaced by a composition of a second conductive glue layer 222 and a third conductive pillar layer 224, while the second conductive glue layer 222 and the third conductive pillar layer 224 can be formed in equal line widths or unequal line widths.

Figure 22:
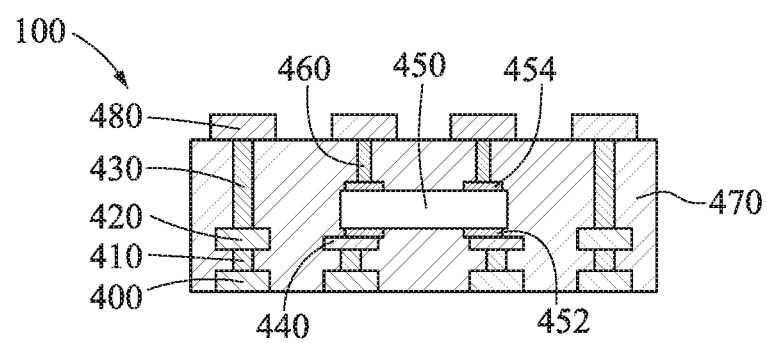
FIG. 22 is schematic diagram showing a package apparatus according to a ninth embodiment of the present invention.

Please refer to FIG. 22, which is a flow chart depicting steps performing in a method for manufacturing a package apparatus of a ninth embodiment of the present invention. In FIG. 22, a package apparatus 100 is disclosed, which comprises: a first conductive wiring layer 400; a first conductive pillar layer 410, disposed on the first conductive wiring layer 400; a second conductive wiring layer 420, disposed on the first conductive pillar layer 410; a third conductive pillar layer 430, disposed on the second conductive wiring layer 420; a first conductive glue layer 440, disposed on the first conductive pillar layer 410; an internal component 450, composed of a first electrode layer 452 and a second electrode layer 454 in a manner that the first electrode layer 452 is disposed and electrically connected to the first conductive glue layer 440; a second conductive pillar layer, disposed on the second electrode layer 454 of the internal component 450; a first molding compound layer 470; and a third conductive wiring layer 480.

It is note that the first conductive glue layer 440 can be formed by a dispense process or a print process, but is not limited thereby; and the internal component 450 can be a component selected from the group consisting of: an active component, a passive component, and a semiconductor chip, but is not limited thereby.

In addition, the first conductive wiring layer 400, the first conductive pillar layer 410, the second conductive wiring layer 420, the second conductive pillar layer 430, the first conductive glue layer 440, the internal component 450, and the third conductive pillar layer 460 can be disposed inside the first molding compound layer 470, whereas the third conductive wiring layer 480 is disposed on the second conductive pillar layer 430, the third conductive pillar layer 460 and the first molding compound layer 470. Similarly, each of the first conductive wiring layer 400, the second conductive wiring layer 420 and the third conductive wiring layer 480 includes at least one wire or at least one chip seat, but is also not limited thereby. The formation of each and every component shown in this embodiment is the same as the aforesaid embodiments, and thus will not be described further herein.

Figure 23:
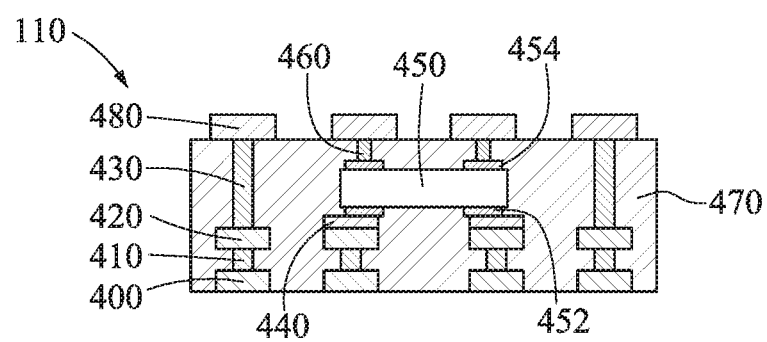
FIG. 23 is schematic diagram showing a package apparatus according to a tenth embodiment of the present invention.

Please refer to FIG. 23, which is a flow chart depicting steps performing in a method for manufacturing a package apparatus of a tenth embodiment of the present invention. As shown in FIG. 23, a package apparatus 110 comprises: a first conductive wiring layer 400, a first conductive pillar layer 410, a second conductive wiring layer 420, a second conductive pillar layer 430, a first conductive glue layer 440, an internal component 450, a third conductive pillar layer 460, a first molding compound layer 470 and a third conductive wiring layer 480.

Comparing with the ninth embodiment, the first conductive glue layer 440 in the package apparatus of the tenth embodiment is disposed on the second conductive wiring layer 420. Other than that, the package apparatuses shown in both the ninth embodiment and the tenth embodiment are formed similar to those in the second embodiment and the fourth embodiment, whereas the first conductive pillar layer 410 can be composed of at least two layers of conductive pillars with equal or unequal line widths; and also the first conductive glue layer 440 can be composed of at least two layers of conductive glues with equal or unequal line widths.

Figure 1:
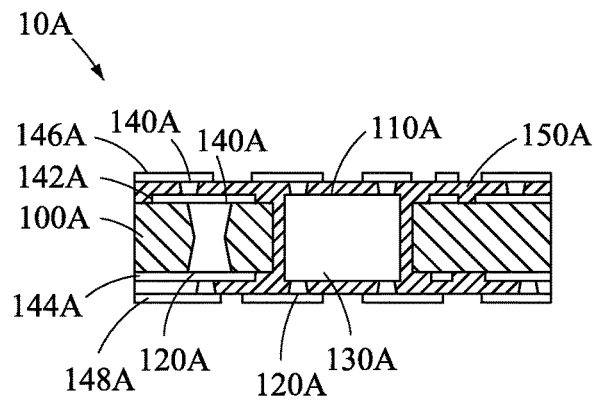
FIG. 1 is schematic diagram showing a conventional package apparatus with fiberglass substrate.

To sum up, comparing to the conventional package apparatus 10A of fiberglass substrate shown in FIG. 1, the package apparatus of the present invention uses a molding compound layer or more than one molding compound layer as the major part in the manufacturing of a coreless substrate, by that not only a less expensive molding compound substrate can be used for replacing the costly conventional fiberglass substrate, but also the conventional expensive and time consuming laser blind/buried hole formation process can be replaced by a faster and simpler electroplating conductive pillar process. Moreover, by the use of a dispense process or a print process for adhering accurately a layer of conductive glue on the first electrode layer while allowing the relative position between the conductive glue and the electrodes to be adjusted according to actual requirements, not only the electrical properties and signal stability are enhanced, but also the usability of the circuit layout within confined space can be improved by the reduction in structure thickness and substrate size. In addition, since it is no longer required to use a laser drill process for forming holes of electrical connections, the via holes or blind holes needed in the substrate can be formed into any shapes at will for enabling more flexible design. Further, by the use of the molding compound layer for allowing the internal component to be disposed inside the molding compound layer, the substrate size can be reduced further for not only enabling the usability of the circuit layout within confined space to be improved further, but also improving the reliability of the components inside the molding compound layer and thus decreasing the manufacturing cost. It is noted that by the use of the plural layers of molding compounds, the design with thinner wires or the design with signal connection wires under the internal component can be allowed and encouraged.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package apparatus, comprising: a first conductive wiring layer; a first conductive pillar layer, disposed on the first conductive wiring layer;
   a first conductive glue layer, disposed on the first conductive wiring layer;
   an internal component, formed with a first electrode layer and a second electrode layer in a manner that the first electrode layer is disposed and electrically connected to the first conductive glue layer; a second conductive pillar layer, disposed on the second electrode layer of the internal component;
   a first dielectric material layer; and a second conductive wiring layer, disposed on the first conductive pillar layer, the second conductive pillar layer and the first dielectric material layer; wherein, the first conductive wiring layer, the first conductive pillar layer, the first conductive glue layer, the internal component and the second conductive pillar layer are disposed inside the first dielectric material layer;
   wherein the first conductive glue layer is composed of two conductive glues, and the first electrode layer is composed of two electrodes, while the distance between the centers of the two conductive glues is larger than the distance between the centers of the electrodes; and
   wherein the first conductive pillar layer is composed of a plural layers of conductive pillar layers.

2. The package apparatus of claim 1, wherein the first conductive glue layer is composed of two conductive glues, and the first electrode layer is composed of two electrodes, while the distance between the centers of the two conductive glues is not larger than the distance between the centers of the electrodes.

3. The package apparatus of claim 1, further comprising:
   a second dielectric material layer, formed on the first dielectric material layer for enabling the first conductive glue layer, the internal component, the first conductive pillar layer, and the second conductive pillar layer to be disposed inside the second dielectric material layer.

4. The package apparatus of claim 1, wherein the first conductive pillar layer is formed as a layer selected from the group consisting of: a layer of cuboid-shaped conductive pillars, a layer of cylinder-shaped pillars, and a layer of polyhedron-shaped pillars.

5. The package apparatus of claim 1, wherein the first conductive glue layer includes a second conductive glue layer and a third conductive glue layer, and the second conductive glue layer is disposed on the first conductive wiring layer, while the two ends of the third conductive glue layer are disposed respectively on the second conductive glue layer and the first electrode layer.

6. The package apparatus of claim 1, wherein the first conductive glue layer is composed of a plural layers of conductive glue.

7. The package apparatus of claim 1, wherein the first conductive glue layer is formed as a layer selected from the group consisting of: a cuboid-shaped conductive glue layer, a 1 cylinder-shaped conductive glue layer, and a polyhedron-shaped conductive glue layer.

8. A package apparatus, comprising:
a first conductive wiring layer;
a first conductive pillar layer, disposed on the first conductive wiring layer;
a second conductive wiring layer, disposed on a specific portion of the first conductive wiring layer;
a second conductive pillar layer, disposed on the second conductive wiring layer;
a first conductive glue layer, disposed on the first conductive pillar layer;
an internal component, formed with a first electrode layer and a second electrode layer in a manner that the first electrode layer is disposed and electrically connected to the first conductive glue layer;
a third conductive pillar layer, disposed on the second electrode layer of the internal component;
a first molding compound layer; and
a third conductive wiring layer, disposed on the second conductive pillar layer, the third conductive pillar layer and the first molding compound layer;
wherein, the first conductive wiring layer, the first conductive pillar layer, the second conductive wiring layer, the second conductive pillar layer, the first conductive glue layer, the internal component and the third conductive pillar layer are disposed inside the first molding compound layer.

9. A package apparatus, comprising:
a first conductive wiring layer;
a first conductive pillar layer, disposed on the first conductive wiring layer;
a second conductive wiring layer, disposed on the first conductive wiring layer;
a second conductive pillar layer, disposed on the second conductive wiring layer;
a first conductive glue layer, disposed on the second conductive wiring layer;
an internal component, formed with a first electrode layer and a second electrode layer in a manner that the first electrode layer is disposed and electrically connected to the first conductive glue layer;
a third conductive pillar layer, disposed on the second electrode layer of the internal component;
a first molding compound layer; and
a third conductive wiring layer, disposed on the second conductive pillar layer, the third conductive pillar layer and the first molding compound layer;
wherein, the first conductive wiring layer, the first conductive pillar layer, the second conductive pillar layer, the first conductive glue layer, the internal component and the third conductive pillar layer are disposed inside the first molding compound layer.

* * * * *